US010957656B2

(12) United States Patent
Yazzie et al.

(10) Patent No.: US 10,957,656 B2
(45) Date of Patent: Mar. 23, 2021

(54) INTEGRATED CIRCUIT PACKAGES WITH PATTERNED PROTECTIVE MATERIAL

(71) Applicant: Intel Corporation, Santa Clara, CA (US)

(72) Inventors: Kyle Yazzie, San Tan Valley, AZ (US); Naga Sivakumar Yagnamurthy, Chandler, AZ (US); Pramod Malatkar, Chandler, AZ (US); Chia-Pin Chiu, Tempe, AZ (US); Mohit Mamodia, Chandler, AZ (US); Mark J. Gallina, Hillsboro, OR (US); Rajesh Kumar Neerukatti, Tempe, AZ (US); Joseph Bautista, Gilbert, AZ (US); Michael Gregory Drake, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/641,601

(22) PCT Filed: Sep. 27, 2017

(86) PCT No.: PCT/US2017/053694
§ 371 (c)(1),
(2) Date: Feb. 24, 2020

(87) PCT Pub. No.: WO2019/066801
PCT Pub. Date: Apr. 4, 2019

(65) Prior Publication Data
US 2020/0357752 A1    Nov. 12, 2020

(51) Int. Cl.
*H01L 23/40* (2006.01)
*H01L 23/00* (2006.01)
(Continued)

(52) U.S. Cl.
CPC ........ *H01L 23/562* (2013.01); *H01L 23/3672* (2013.01); *H01L 23/49827* (2013.01)

(58) Field of Classification Search
CPC ............. H01L 23/562; H01L 23/49827; H01L 2023/405
(Continued)

(56) References Cited

U.S. PATENT DOCUMENTS 5,863,814 A    1/1999  Alcoe et al.
5,909,057 A *  6/1999  McCormick .......... H01L 21/563
                                                    257/680
(Continued)

FOREIGN PATENT DOCUMENTS

WO    2019066801 A1    4/2019

OTHER PUBLICATIONS

PCT International Search Report and Written Opinion of PCT/US2017/053694 dated Jun. 22, 2018; 17 pages.

*Primary Examiner* — Sherman Ng
(74) *Attorney, Agent, or Firm* — Patent Capital Group

(57) ABSTRACT

Disclosed herein are integrated circuit (IC) packages with an electronic component having a patterned protective material on a face, as well as related devices and methods. In some embodiments, a computing device may include: an integrated circuit (IC) package with an electronic component having a protective material on the back face of the electronic component, where the protective material is patterned to include an area on the back face of the electronic component that is not covered by the protective material; a circuit board, where the IC package is electrically coupled to the circuit board; and a heat spreader, where the heat spreader is secured to the circuit board and in thermal contact with the area on the back face of the electronic component that is not covered by the protective material.

13 Claims, 11 Drawing Sheets

(51) Int. Cl.
*H01L 23/367* (2006.01)
*H01L 23/498* (2006.01)

(58) Field of Classification Search
USPC .......................................................... 361/704
See application file for complete search history.

(56) References Cited

U.S. PATENT DOCUMENTS

| | | |
|---|---|---|
| 6,294,408 B1 | 9/2001 | Edwards et al. |
| 6,724,080 B1* | 4/2004 | Ooi .................. H01L 23/36 257/704 |
| 2003/0030140 A1* | 2/2003 | Shim .................. H01L 23/16 257/712 |
| 2006/0202325 A1 | 9/2006 | Coico et al. |
| 2006/0260793 A1* | 11/2006 | Yang .................. H01L 23/34 165/185 |
| 2007/0090518 A1* | 4/2007 | Sauciuc .............. H01L 35/16 257/706 |
| 2008/0111234 A1* | 5/2008 | Hua .................. H01L 23/367 257/713 |
| 2011/0147912 A1* | 6/2011 | Karpur .............. H01L 21/563 257/687 |
| 2012/0050996 A1* | 3/2012 | Loo .................. H01L 21/50 361/709 |
| 2013/0273694 A1 | 10/2013 | Hsieh et al. |
| 2015/0228553 A1* | 8/2015 | Saeidi ................ H01L 23/16 257/712 |
| 2016/0079150 A1 | 3/2016 | Chawla et al. |

* cited by examiner

```
┌─────────────────────────────────────────────────────────────────┐
│   ELECTRICALLY COUPLE AN IC PACKAGE TO A CIRCUIT BOARD, WHERE THE│
│   IC PACKAGE INCLUDES AN ELECTRONIC COMPONENT HAVING A PROTECTIVE│
│   MATERIAL ON A BACK FACE, WHEREIN THE PROTECTIVE MATERIAL IS PATTERNED│
│   TO INCLUDE AN AREA ON THE BACK FACE OF THE ELECTRONIC COMPONENT│
│             THAT IS NOT COVERED BY THE PROTECTIVE MATERIAL       │
│                                 1002                             │
└─────────────────────────────────────────────────────────────────┘
                                  │
                                  ▼
┌─────────────────────────────────────────────────────────────────┐
│  ATTACH A HEAT SPREADER TO THE CIRCUIT BOARD, WHERE THE HEAT SPREADER IS IN│
│     THERMAL CONTACT WITH THE AREA ON THE BACK FACE OF THE ELECTRONIC│
│            COMPONENT THAT IS NOT COVERED BY THE PROTECTIVE MATERIAL│
│                                 1004                             │
└─────────────────────────────────────────────────────────────────┘
```

FIG. 10

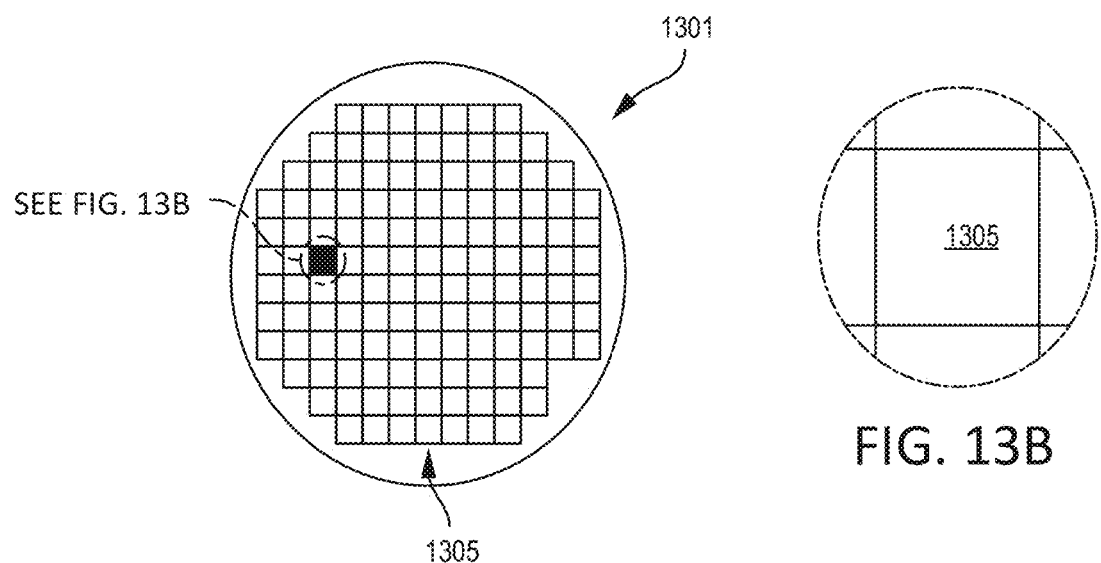
FIG. 13A
FIG. 13B
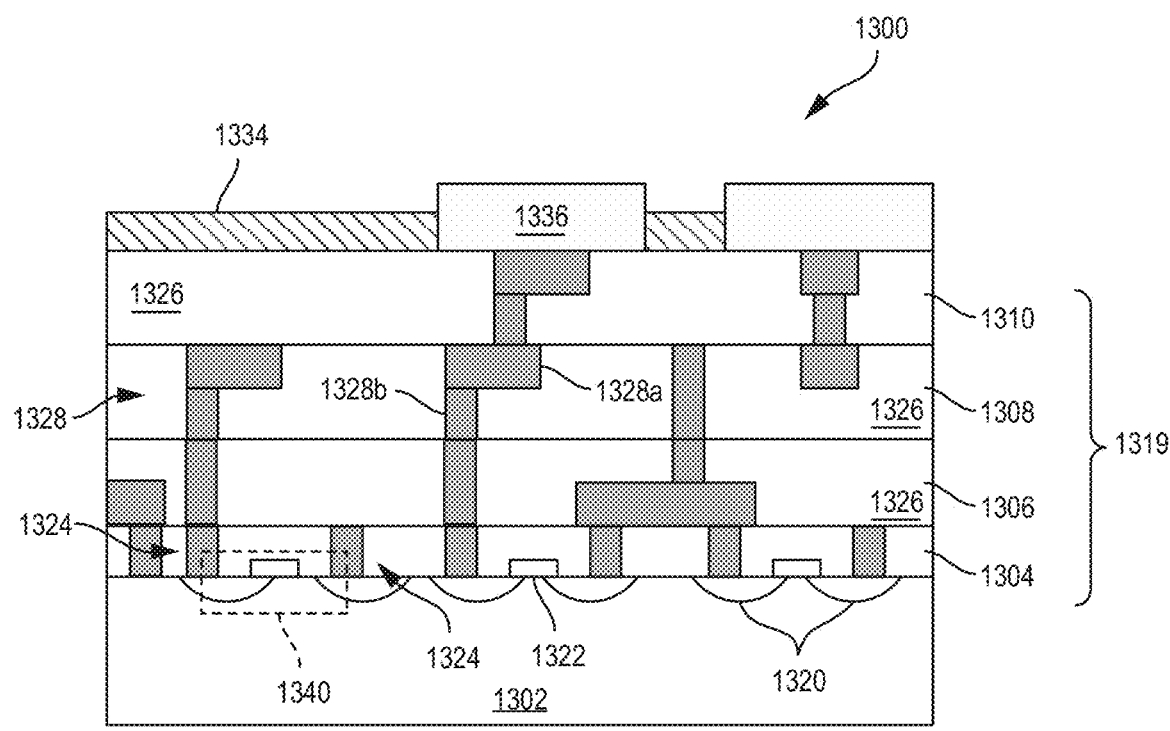
FIG. 13C

INTEGRATED CIRCUIT PACKAGES WITH PATTERNED PROTECTIVE MATERIAL

CROSS-REFERENCE TO RELATED APPLICATION

This application is a national stage application under 35 U.S.C. § 371 of PCT International Application Serial No. PCT/US2017/053694, filed on Sep. 27, 2017 and entitled "INTEGRATED CIRCUIT PACKAGES WITH PATTERNED PROTECTIVE MATERIAL," which is hereby incorporated by reference herein in its entirety.

BACKGROUND

Electronic components, such as microprocessors and integrated circuits, generally produce heat. Excessive heat may degrade performance, reliability, life expectancy of an electronic component and may even cause component failure. Heat sinks, cold plates, and other similar thermal solutions are commonly used for dissipating heat and reducing the operational temperature of electronic components.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 10 is a flow diagram of an example method of manufacturing an IC structure including an IC package with an electronic component having a patterned protective layer and a thermal solution, in accordance with various embodiments.

FIGS. 13A and 13B are top views of a wafer and dies that may be used with any of the embodiments of the IC packages having a patterned protective layer disclosed herein.

FIG. 13C is a cross-sectional side view of an IC device that may be used with any of the embodiments of the IC packages having a patterned protective layer disclosed herein.

DETAILED DESCRIPTION

Figure 1A:
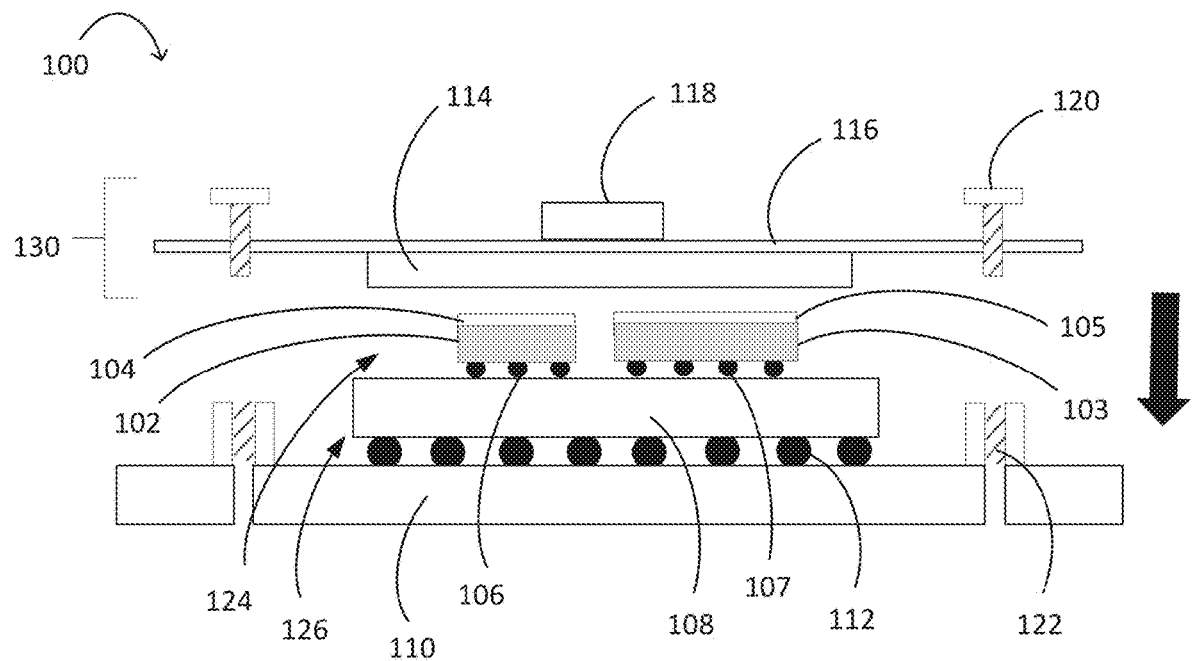
FIGS. 1A-1B are various views of an integrated circuit (IC) structure including a conventional thermal solution.

Disclosed herein are integrated circuit (IC) packages having a patterned protective material and structures to minimize stress fractures of electronic components, as well as related devices and methods. For example, in some embodiments, a computing device may include: an integrated circuit (IC) package including: a package substrate having a first face and an opposing second face; an electronic component having a front face and an opposing back face, where the front face of the electronic component is electrically coupled to the first face of the package substrate, and a patterned protective material on the back face of the electronic component, where the protective material is patterned to include an area on the back face of the electronic component that is not covered by the protective material; a circuit board, where the second face of the package substrate is electrically coupled to a face of the circuit board; and a heat spreader, where the heat spreader is secured to the circuit board and in thermal contact with the area on the back face of the electronic component that is not covered by the protective material through a thermal interface material. A method including: electrically coupling an IC package to a circuit board, wherein the IC package includes: a package substrate having a first face and an opposing second face; an electronic component having a front face and an opposing back face, where the front face is coupled to the package substrate and the back face has a protective material, where the protective material is patterned to include an area on the back face of the electronic component that is not covered by the protective material; and securing a heat spreader to the circuit board, where the heat spreader is in thermal contact with the area on the back face of the electronic component that is not covered by the protective material.

In some embodiments, an IC package may include: a package substrate; a die coupled to a face of the package substrate; and a spacer on the face of the package substrate positioned, outside the foot print of the die, between the die and an outside edge of the package substrate. In some embodiments, a thickness of a spacer is equal to or greater than a thickness of a die. In some embodiments, a spacer is positioned closer to an outside edge of a package substrate as compared to a die and a thickness of the spacer is less than a thickness of the die. In some embodiments, an IC package may further include a die having a front face and an opposing back face, where the front face is coupled to the package substrate and the back face has a patterned protective material. In some embodiments, a computing device may include: a circuit board; an IC package disposed on the circuit board, wherein the IC package includes: a package substrate; an electronic component coupled to a face of the package substrate; and a spacer on the face of the package substrate located between the electronic component and an outside edge of the package substrate; and a heat spreader, wherein the heat spreader is secured to the circuit board and in contact with the spacer on the face of the package substrate.

In some embodiments, an IC package may include: a package substrate; an electronic component having a front face and an opposing back face, wherein the front face is electrically coupled to a face of the package substrate, wherein the back face has a hot spot, and wherein the hot spot is an area on the back face that exceeds a temperature of 80 degrees Celsius during operation of the electronic component; and a patterned protective material on the back face of the electronic component, wherein the patterned protective material exposes the hot spot. A method including: creating a power map of a face of an electronic component to identify a hot spot area on the face that exceeds a temperature of 80 degrees Celsius during operation of the electronic component; determining a pattern for the protective material, where the pattern exposes the hot spot area; and providing the protective material on the face of the electronic component based on the determined pattern. In some embodiments, the patterned protective material is a patterned die backside film (DBF) or a patterned die attach film (DAF).

Some conventional IC devices may include a thermal solution, such as a heat spreader, a heat sink, or a cold plate, in order to transport heat generated by the electronic component during operation away from the electronic component. Typically, a thermal solution is in thermal contact with a back side of an electronic component on an IC package and transfers heat via thermal conduction. Some such IC devices may suffer from reliability issues due to stress fractures (e.g., cracking and chipping of the electronic component) that may occur when the thermal solution is secured to the IC device. Some IC packages for use with a thermal solution may include a protective film on the back side of the electronic component to prevent stress fractures, which may inhibit thermal transfer. A thermal solution may be secured tightly to assure a good thermal contact interface, and secured even more tightly with an electronic component having a protective film, which is likely to cause stress fractures or result in breakage of the IC package. These reliability issues may be particularly costly as breakage occurs in the final IC device and the entire IC package must be discarded.

Figure 1B:
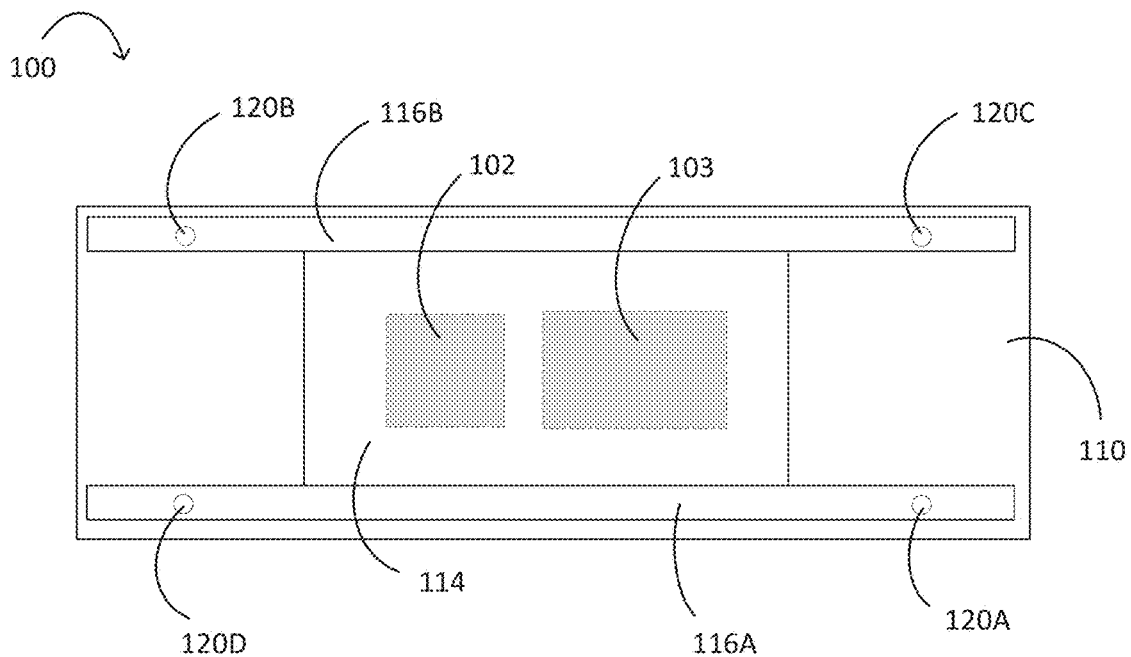

FIGS. 1A-1B are various views of an integrated circuit (IC) structure including a conventional thermal solution. In particular, FIG. 1A is a side cross-sectional view of an IC structure 100 with a conventional thermal solution, and FIG. 1 is a top view of the IC structure 100 of FIG. 1A. The IC structure 100 may include package substrate 108 and one or more electrical components 102, 103 disposed thereon. Multiple electrical components 102, 103 may include a continuous protective film 104, 105 on the back side, as illustrated. Continuous protective film may include a die back side film (DBF) or a die attach film (DAF). Multiple electrical components 102, 103 may be coupled to a first face 124 of the package substrate 108 via first level interconnects 106, 107, as illustrated. A second face 126 of package substrate 108 may be coupled to a circuit board 110, such as a mother board, via second level interconnects 112. IC device may include thermal solution 130. Thermal solution 130 may include a heat spreader 114, a spring plate (e.g., leaf spring) 116, a heat pipe 118, a fastener 120, 122 (e.g., a screw, a rivet, or a clip) for securing thermal solution 130 to circuit board 110. Assembly 100 may further include a backing plate (not shown) for attaching thermal solution 130 to circuit board 110. A conventional thermal solution may include a heat spreader or a cold plate, a heat pipe, and cooling fins, as well as other structures to hasten cooling. When thermal solution 130 is attached to circuit board 110, cold plate 114 is in thermal contact with the protective film 104, 105 on the back side of electrical components 102, 103 to conduct heat away from the electrical component. Spring plate 116 may apply a force to improve the thermal contact between cold plate 114 and protective films 104, 105 on electrical components 102, 103. A thermal interface material (TIM) may be included between cold plate 114 and protective films 104, 105 on electrical components 102, 103 to further improve thermal contact in the interface (not shown). TIM is a thermally conductive material and may be applied as a thermal pad, an adhesive, a gel, or a grease. Heat pipe 118 may optimize heat transfer from electrical components 102, 103 by transporting heat away from cold plate 114 and hastening cooling.

FIG. 1 is a top view of the IC structure 100 of FIG. 1A with the heat pipe 118 omitted. IC device may include circuit board 110, cold plate 114, one or more electrical components 102, 103 positioned underneath cold plate 114, and one or more leaf springs 116A, 116B having multiple fasteners 120A-120D. Cold plate 114 may be attached to circuit board 110 via leaf springs 116A, 116B and fasteners 120A-120D. When cold plate 114 is attached to circuit board 110, fasteners typically are secured in the following sequence, fastener 120A, fastener 120B, fastener 120C, and fastener 120D. Stress fractures are more likely to occur when fastener 120C is tightened and stress is concentrated in the corner near fastener 120C. A traditional method for reducing such stress fractures is to increase the thickness of a protective film on the back side of the electrical components, however, a protective film typically has low thermal conductivity and an increased thickness is likely to further inhibit heat transfer.

Various ones of the IC structures disclosed herein may avoid breakage when securing a thermal solution while providing an improved thermal contact interface between the thermal solution and an IC package. These IC packages may exhibit improved reliability relative to previous packages.

In the following detailed description, reference is made to the accompanying drawings that form a part hereof, wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the disclosed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, a "high-k dielectric material" may refer to a material having a higher dielectric constant than silicon oxide.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The terms "electrical component" and "electronic component" may be used interchangeably. The accompanying drawings are not necessarily drawn to scale. For ease of discussion, the singular term of a Figure may be used to refer to the collection of drawings of that referenced Figure. For example, the term "FIG. 1" may be used to refer to the collection of drawings of FIGS. 1A-1B.

Figure 2A:
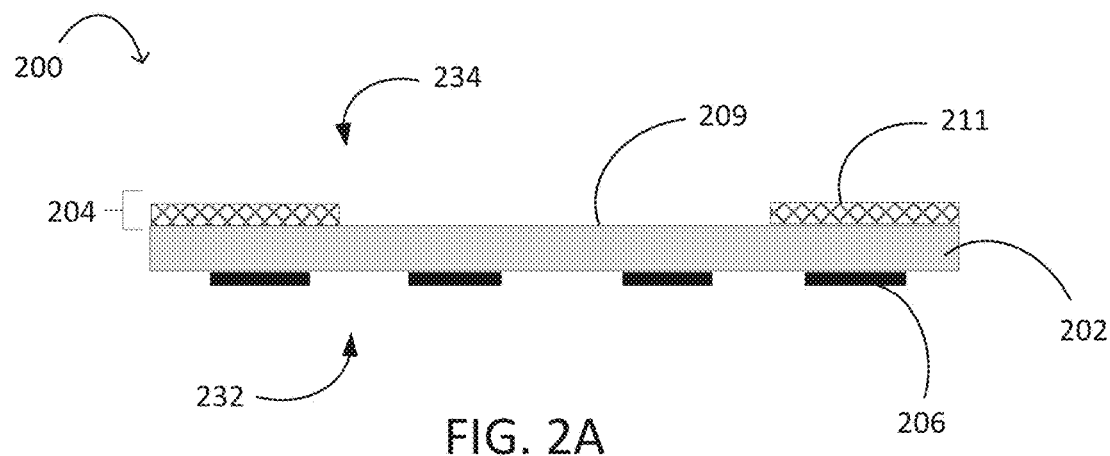
FIG. 2A is a cross-sectional side view of an exemplary electronic component having a patterned protective material, in accordance with various embodiments.

FIG. 2A is a cross-sectional side view of an exemplary electronic component 200 having a patterned protective material, in accordance with various embodiments. Electronic component 200 may include die 202 having a front face 232 and an opposing back face 234, a patterned protective material 204 on back face 234, and interconnects 206 on front face 232. Protective material may be patterned such that back face 234 has an area that is covered by protective material (i.e., "a covered area") 211 and an area that is not covered by protective material (i.e., "an uncovered area" or "an exposed area") 209. In some embodiments, die 202 may include a singulated die. In some embodiments, die 202 may include a plurality of dies and may be a wafer having a plurality of dies formed thereon. In some embodiments, die 202 may be a structure incorporating a die, such as a die stack bonded together. Die 202 may be configured to perform any suitable function, including a memory device (e.g., a static random access memory (SRAM) device), a logic device (e.g., AND, OR, NAND, or NOR gate), or any other suitable circuit element. In some embodiments, die 202 may be a bare die.

Any suitable material or materials may be used to form the patterned protective material 204. For example, in some embodiments, the patterned protective material 204 may include a metal, such as copper, aluminum, titanium, or steel. In some embodiments, the patterned protective material 204 may include a polymer material, such as polyurethane, polyimide, silicone (e.g., polydimethylsiloxane), epoxy, acrylic, neoprene, rubber, polyester elastomer, and polyether ether ketone (PEEK). In some embodiments, the patterned protective material 204 may include a plastic material. Such a plastic material may have a melting temperature greater than the melting temperature of a hot spot area of the electronic component during operation (e.g., approximately 80 degrees Celsius for some electronic components, and may have a temperature range of 80 degrees Celsius to 125 degrees Celsius) in order to avoid melting or warpage of the patterned protective material 204 during operation of the electronic component. In some embodiments, the patterned protective material 204 may include an adhesive material or a resin material. In some embodiments, the patterned protective material 204 may include filler material, such as ceramic, glass, or silica, among others. In some embodiments, the patterned protective material is a patterned die back side film (DBF) or a patterned die attach film (DAF).

The material or materials chosen for the patterned protective material 204 may be selected to achieve various material properties. For example, in some embodiments, the patterned protective material 204 may have a Young's Modulus value of up to 2-3 GPa at room temperature before cure and a Young's Modulus value of greater than 3 GPa at room temperature after cure. In some embodiments, the patterned protective material 204 may have a Young's Modulus value of greater than 10 MPa at higher temperatures for adhesive bonding before cure, and a Young's Modulus value of about 100 MPa to 15 GPa at 100 degrees Celsius after cure. In some embodiments, the patterned protective material 204 may have a glass transition temperature range of about 125-180 degrees Celsius. In some embodiments, the patterned protective material 204 may have a thermal conductivity lower than the thermal conductivity of copper (e.g., lower than 385 Watts per meter Kelvin) or of aluminum (e.g., lower than 205 Watts per meter Kelvin). In some embodiments, the patterned protective material 204 may have a thermal conductivity of about 1-4 Watts per meter Kelvin. In some embodiments, the patterned protective material 204 need not function as a thermal conductor, so the thermal conductivity of the patterned protective material 204 may be lower than would be acceptable for a heat spreader, heat sink, cold plate, or other thermal solution.

Any suitable techniques may be used to provide patterned protective material 204 on die 202, including lamination, and spin coating, among others. In some embodiments, patterned protective material 204 may be applied as an unpatterned layer that may be patterned after placement on die 202 using any suitable process to remove the protective material, such as a laser. In some embodiments, patterned protective material 204 may be applied as a pre-patterned material, for example, applied as a pre-patterned film or dispensed only in areas having protective material according to the pattern. In some embodiments, patterned protective material 204 may be applied to a back side of a die at the wafer level (i.e., prior to singulating a wafer into individual dies). In some embodiments, patterned protective material 204 may be applied to a back side of an individual die (i.e., after singulating a wafer into individual dies). Patterned protective material 204 may have any suitable dimensions. For example, in some embodiments, a thickness or height (e.g., z-height) of the patterned protective material may range from 5 microns to 100 microns. In some embodiments, a thickness of the patterned protective material may range from 5 microns to 50 microns. In some embodiments, a thickness of the patterned protective material may range from 5 microns to 20 microns. In some embodiments, a thickness of the patterned protective material may depend on whether the die is a low power part or a high power part. For example, the patterned protective material may be thicker on a low-power part, and may be thinner on a high-power part to increase thermal conduction.

Figure 2B:
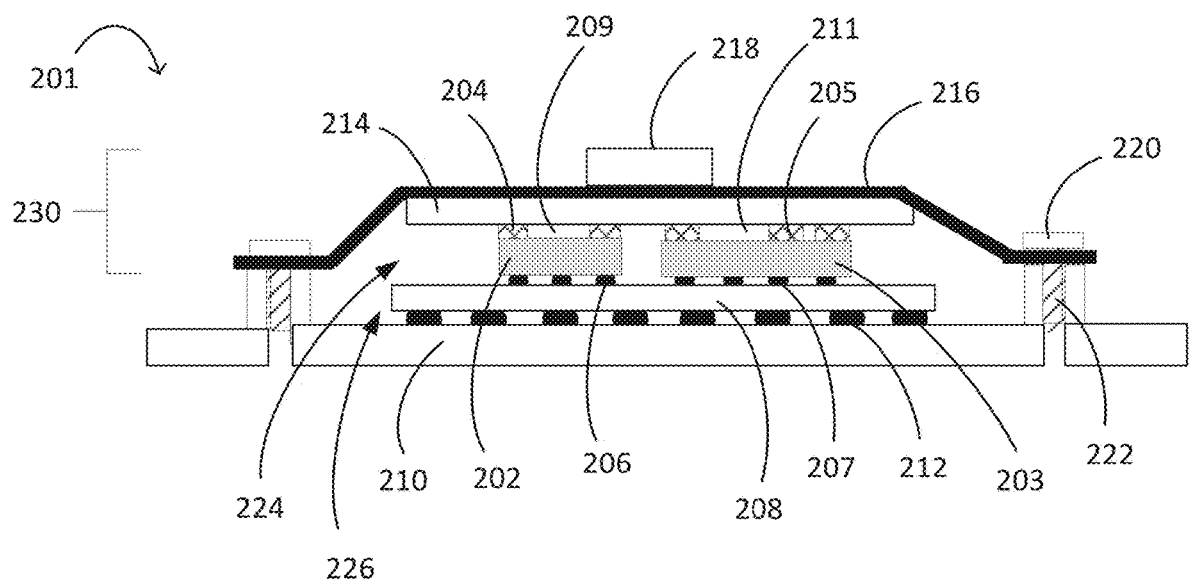
FIG. 2B is a cross-sectional side view of an IC package including multiple electronic components having a patterned protective material and a conventional thermal solution, in accordance with various embodiments.

FIG. 2B is a cross-sectional side view of IC structure 201 with an IC package including multiple electronic components having a patterned protective material and a conventional thermal solution, in accordance with various embodiments. The IC structure 201 may include package substrate 208 and one or more electrical components 202, 203 disposed thereon. Multiple electrical components 202, 203 may include a patterned protective material 204, 205 on the back side, as illustrated. Patterned protective material 204, 205 may be patterned to include an area on the back face of the electrical component that is not covered by the protective material 209, 211. In some embodiments, an area on the back face of an electrical component not covered by protective material may be a hot spot, as described above with reference to FIG. 2A. In some embodiments, patterned protective film may include a patterned die back side film (DBF) or a patterned die attach film (DAF). Multiple electrical components 202, 303 may be coupled to a first face 224 of the package substrate 208 via first level interconnects 206, 207, as illustrated. A second face 226 of package substrate 208 may be coupled to a circuit board 210 via second level interconnects 212. IC structure 201 may include thermal solution 230. Thermal solution 230 may include a heat spreader (or cold plate) 214, a leaf spring 216, a heat pipe 218, a fastener 220, 222 (e.g., a screw, a rivet, or a clip) for securing thermal solution 230 to circuit board 210. When thermal solution 230 is attached to circuit board 210, cold plate 214 is in thermal contact with the patterned protective film 204, 205 on the back side of electrical components 202, 203 to conduct heat away from the electrical component. Leaf spring 216 may apply a force on cold plate 214 to improve the thermal contact between cold plate 214 and patterned protective films 204, 205 as well as the uncovered or exposed areas 209, 211 on the back side of electrical components 202, 203. A thermal interface material (TIM) may be included between cold plate 214 and protective films 204, 205 and uncovered or open areas 209, 211 on the back side of electrical components 202, 203 to further improve thermal contact in the interface (not shown).

In some embodiments, the first level interconnects 206, 207 may include solder bumps or balls (as illustrated in FIG. 2B); in other embodiments, the first level interconnects 206, 207 may include wirebonds or any other suitable interconnect. In particular, the package substrate 208 may include bond pads or other conductive contacts to couple to the first level interconnects 206, 207. In some embodiments, the conductive contacts may be surrounded by solder resist, as known in the art. In some embodiments, underfill material may be disposed around the first level interconnects 206, 207 at the first face 224 of the package substrate 208. In some embodiments, no underfill material may be disposed between the electrical components 202, 203 and the first face 224 of the package substrate 208.

The package substrate 208 may be coupled to a circuit board 210 via the second level interconnects 212 disposed at the second face 226 of the package substrate 208. In some embodiments, the second level interconnects 212 may include solder balls (as illustrated in FIG. 2B) for a ball grid array (BGA) coupling; in other embodiments, the second level interconnects 212 may include solder paste contacts to provide land grid array (LGA) interconnects, or any other suitable interconnect. The circuit board 210 may include conductive pathways (not shown) that allow power, ground, and other electrical signals to move between the circuit board 210 and the electronic components 202, 203 in the IC package, as known in the art. Although FIG. 2B illustrates a single IC package, which includes electronic components 202, 203, package substrate 208, and first level interconnects 206, 207, disposed on the circuit board 210, this is simply for ease of illustration and multiple IC packages may be disposed on the circuit board 210 (e.g., as discussed below with reference to the circuit board 1402 of the assembly 1400 of FIG. 14). In some embodiments, the circuit board 210 may be a printed circuit board (PCB). In some embodiments, the circuit board 210 may be another IC package, and the IC device 201 may be a package-on-package structure. In some embodiments, the circuit board 210 may be an interposer, and the IC device 201 may be a package-on-interposer structure.

The package substrate 208 may include an insulating material and one or more conductive pathways through the insulating material, in accordance with various embodiments. In some embodiments, the insulating material may be provided by a single material, while in other embodiments, the insulating material may include different layers formed of different materials. For example, a "base" layer of insulating material may be provided by a glass fiber reinforced core, a rigid carrier, or a peelable core panel, for example, while additional layers of insulating material may be provided by an epoxy-based laminate. In some embodiments, the package substrate 208 may be an organic substrate. For example, in some embodiments, the insulating material of the package substrate 208 may be an organic material, such as an epoxy-based laminate. The insulating material may be, for example, a build-up film (e.g., Ajinomoto build-up film). The insulating material may include, for example, an epoxy with a phenolic hardener. The conductive pathways in the package substrate 208 may couple any of the electrical components 202, 203 to the circuit board 210 (e.g., via the first level interconnects 206, 207 and the second level interconnects 212), and/or may couple multiple ones of the electrical components 202, 203 to each other (e.g., via the first level interconnects 206, 207). Any suitable arrangement of conductive pathways may couple the electrical components 202, 203 and the circuit board 210, as desired.

Although two electrical components 202, 203 are illustrated in FIG. 2B, this is simply an example, and the IC device 201 may include fewer or more electrical components that have any number of different footprints and heights. The electrical components 202, 203 may have any suitable functionality, and may include passive devices (e.g., resistors, capacitors, and/or inductors), active devices (e.g., processing devices, memory, communications devices, and/or sensors), or any other computing components or circuitry. For example, in some embodiments, the electrical components may include active (e.g., a central processing unit (CPU), platform controller hub (PCH)) and/or passive components (e.g., capacitors, memory devices, radio-frequency (RF) components). In some embodiments, the electrical components 202, 203 may be dies (e.g., as discussed below with reference to FIGS. 13A-13B).

The electrical components 202, 203 may have any suitable dimensions. For example, in some embodiments, the thickness or height (e.g., z-height) of the electrical components 202, 203 (measured from the first face 224) may be between 100 microns and 1.5 millimeters (e.g., between 200 microns and 1 millimeter). In some embodiments, thickness of the electrical components 202, 203 (measured from the first face 224) may be between 100 microns and 750 microns. In some embodiments, thickness of the electrical components 202, 203 (measured from the first face 224) may be between 100 microns and 400 microns.

FIGS. 3A-3F are various top views of a back face of exemplary electronic components having patterned protective material, in accordance with various embodiments. In some embodiments, the patterned protective material 304 may be patterned to expose 306 areas on the back face of electronic component 302. The exposed area 306 may include a hot spot. A hot spot may be an area on the back face of an electronic component where the temperature during operation of the electronic component exceeds 80 degrees Celsius, and, for example, may have a temperature range of 80 degrees Celsius to 125 degrees Celsius. A hot spot generally describes an unwanted localization of heat on a die and is typically associated with structures in the die that generate high power or heat, such as processor cores. Some dies generate high heat (e.g., run hot) such that heat is not localized rather the hot spot covers the entire surface of the die. A power map of a die may be determined from numerical modeling prior to building the die. The power map values for a die may be confirmed empirically using thermal measurement techniques known in the art.

Figure 3A:
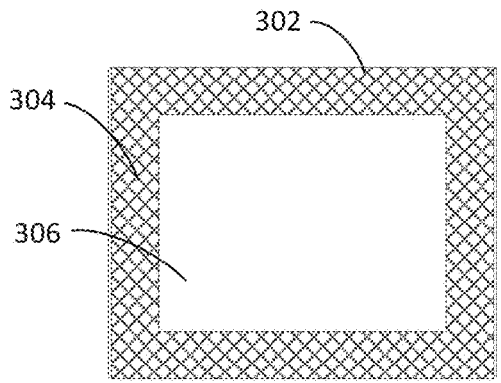
FIGS. 3A-3F are various top views of exemplary electronic components having patterned protective material, in accordance with various embodiments.
Figure 3B:
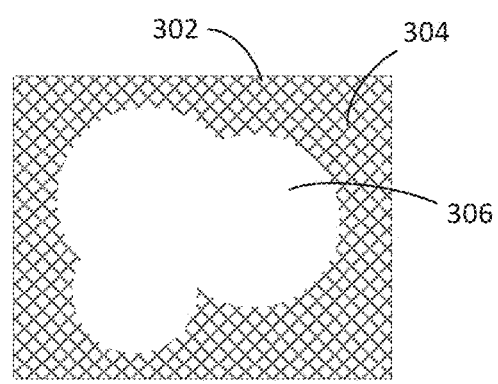
Figure 3C:
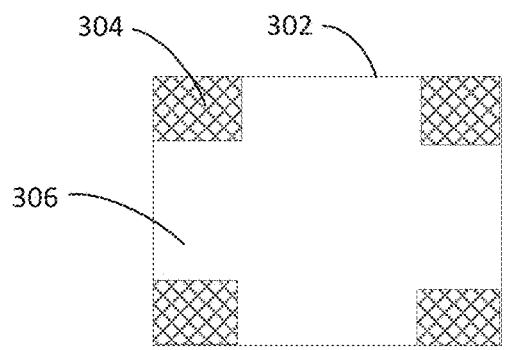
Figure 3D:
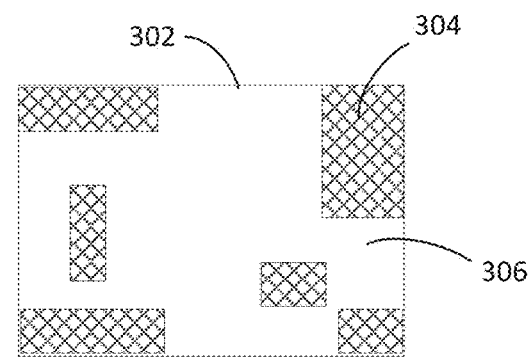
Figure 3E:
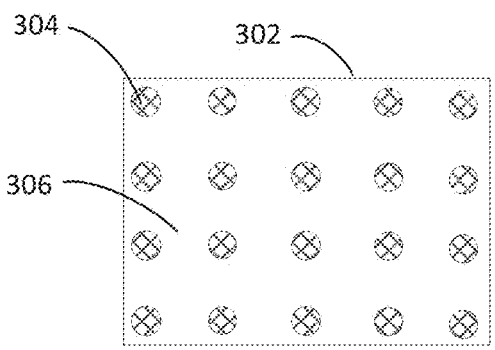
Figure 3F:
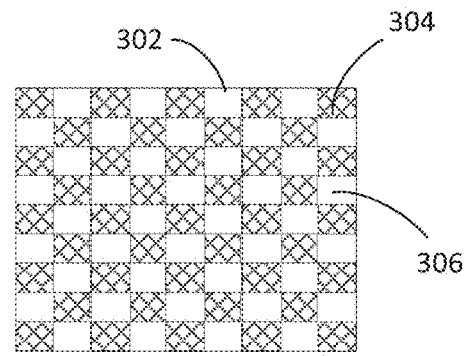

In some embodiments, the patterned protective material 304 may be patterned to increase the exposed contact area between a back face of an electronic component and a thermal solution while still providing protection against stress fractures. For example, the patterned protective material may be patterned to cover 50% or less of a surface area of a back face of a die, as illustrated in FIGS. 3A, 3B, 3C, 3D, and 3E. In another example, the patterned protective material 304 may be patterned as a frame that covers the outer edges of a die to reduce the likelihood of stress fractures and expose the inner area for optimal thermal contact between a back face of an electronic component and a thermal solution, as illustrated in FIG. 3A. In some embodiments, the patterned protective material 304 may be applied to areas of an electronic component that may be more likely to crack or chip, such as the corners of the electronic component, as illustrated in FIGS. 3A, 3B, 3C, 3D, and 3F. In some embodiments, the patterned protective material 304 may be applied to uniformly cover, while still optimally exposing, a back face of an electronic component, as illustrated in FIGS. 3E and 3F.

Figure 4:
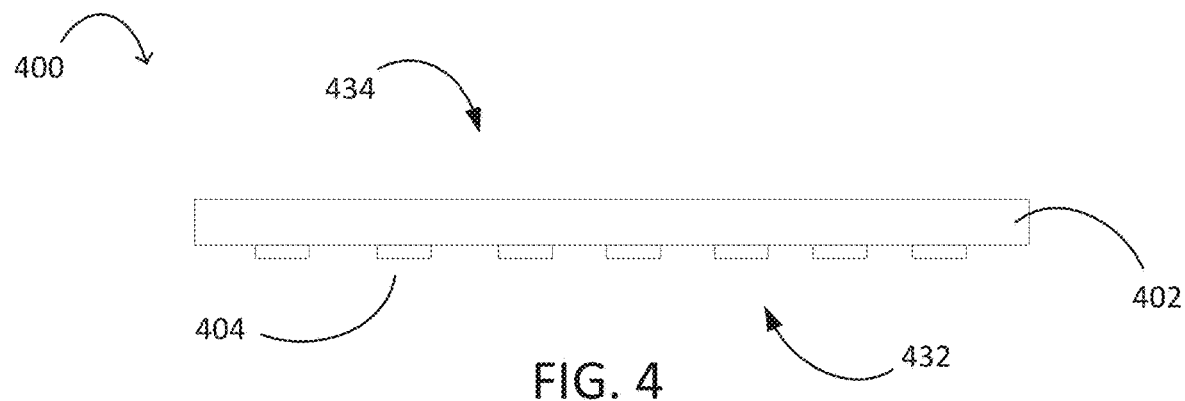
FIGS. 4-6 are cross-sectional side views of various stages of an exemplary manufacture of an electronic component having a patterned protective material, in accordance with various embodiments.
Figure 5:
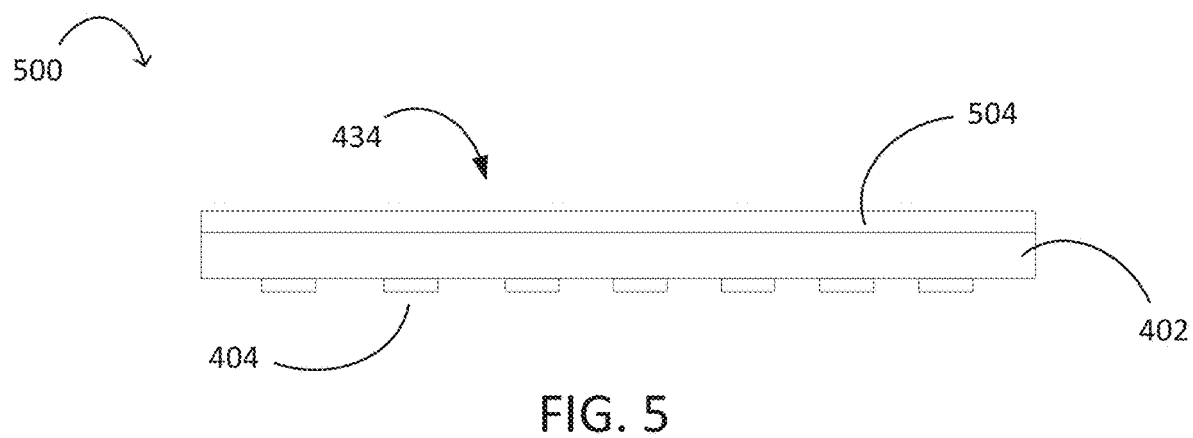
Figure 6:
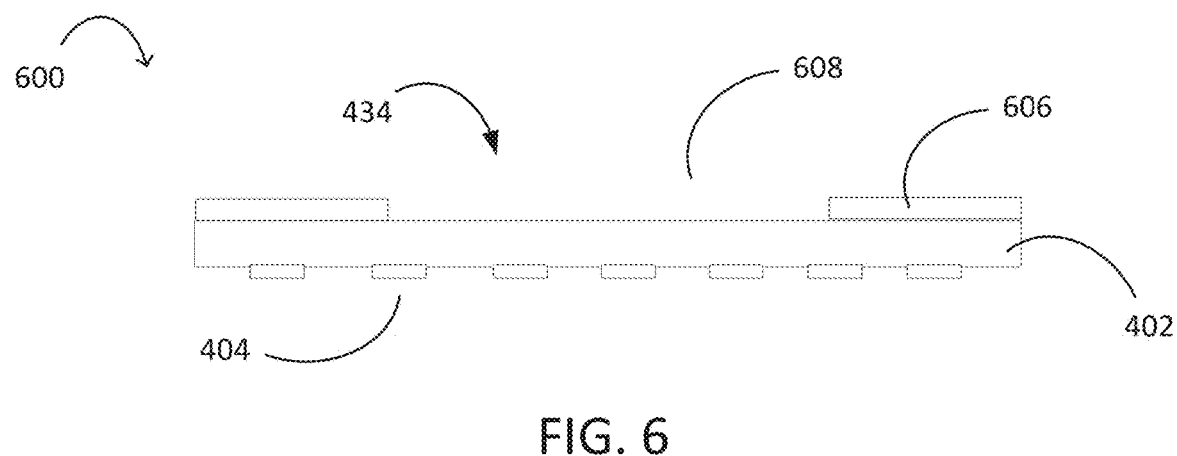

Any suitable techniques may be used to manufacture the IC structures and the IC packages disclosed herein. For example, FIGS. 4-6 are cross-sectional side views of various stages in the manufacture of the IC device 200 of FIG. 2A, in accordance with various embodiments. Although FIGS. 4-6 illustrate the manufacture of the particular IC device 200 illustrated in FIG. 2A, the techniques discussed below with reference to FIGS. 4-6 may be used to manufacture any suitable ones of the IC structures and IC packages disclosed herein.

FIG. 4 is a cross-sectional side view of an assembly 400 including an electronic component 402 having a back side or back face 434 (also referred to herein as an inactive side) and an opposing front side or front face 432 (also referred to herein as an active side), and contacts 404 on the front face 432 of electrical component 402.

FIG. 5 is a cross-sectional view of assembly 400 subsequent to providing a protective material 504 on the back face 434 of electrical component 402.

FIG. 6 is a cross-sectional side view of an assembly 500 subsequent to removing portions of protective material 504 to provide a patterned protective material 606, which includes exposed portions 608 of the back face 434 of the electrical component 402. Protective material 504 may be patterned by removing portions of the protective material, for example, by a laser.

Figure 7:
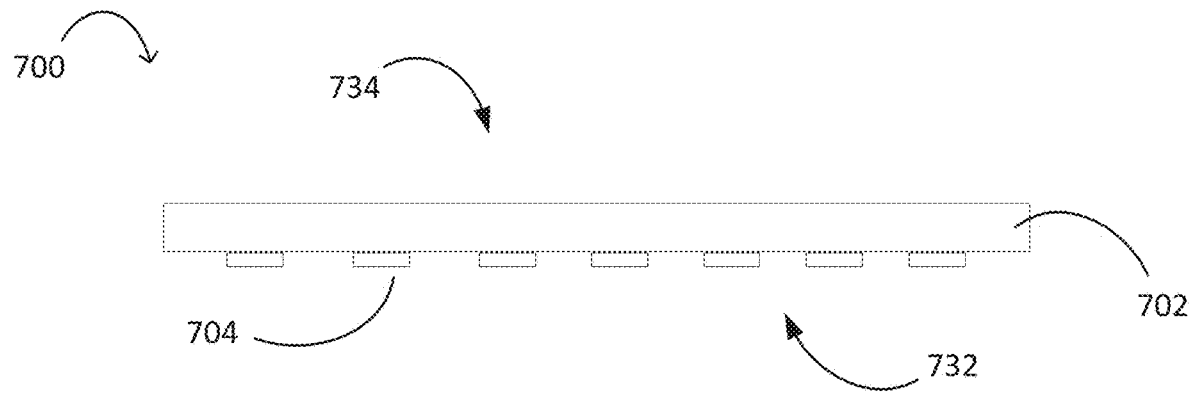
FIGS. 7-8 are cross-sectional side views of various stages of another exemplary manufacture of an electronic component having a patterned protective material, in accordance with various embodiments.
Figure 8:
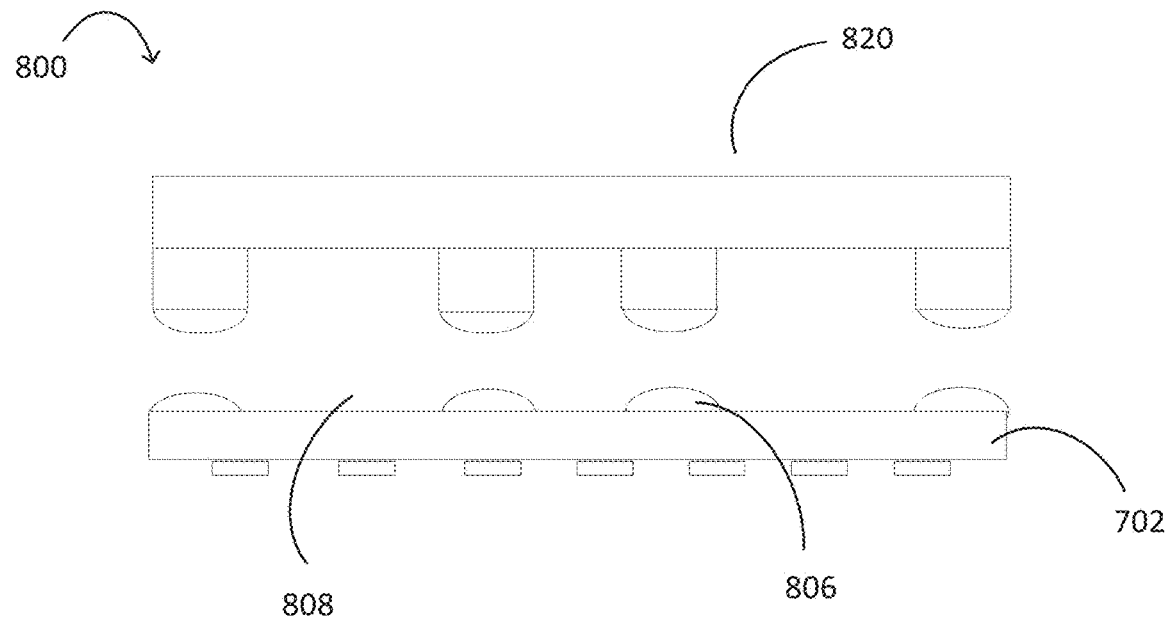

FIGS. 7-8 are cross-sectional side views of various stages in the manufacture of an IC device having a patterned protective material, in accordance with various embodiments. The techniques discussed below with reference to FIGS. 7-8 may be used to manufacture any suitable ones of the IC structures and IC packages disclosed herein.

FIG. 7 is a cross-sectional side view of an assembly 700 including an electronic component 702 having a back face 734 and an opposing front face 732, and contacts 704 on the front face 732 of electrical component 702.

FIG. 8 is a cross-sectional view of assembly 700 subsequent to providing a patterned protective material 806 on the back face 734 of electrical component 702. Patterned protective material 806 includes exposed portions 808 of the back face 434 of the electrical component 702. Patterned protective material 806 may be applied using an applicator 820, such as a rubber sponge or a stamp, having a pattern that corresponds to the pattern of the patterned protective material.

Figure 9:
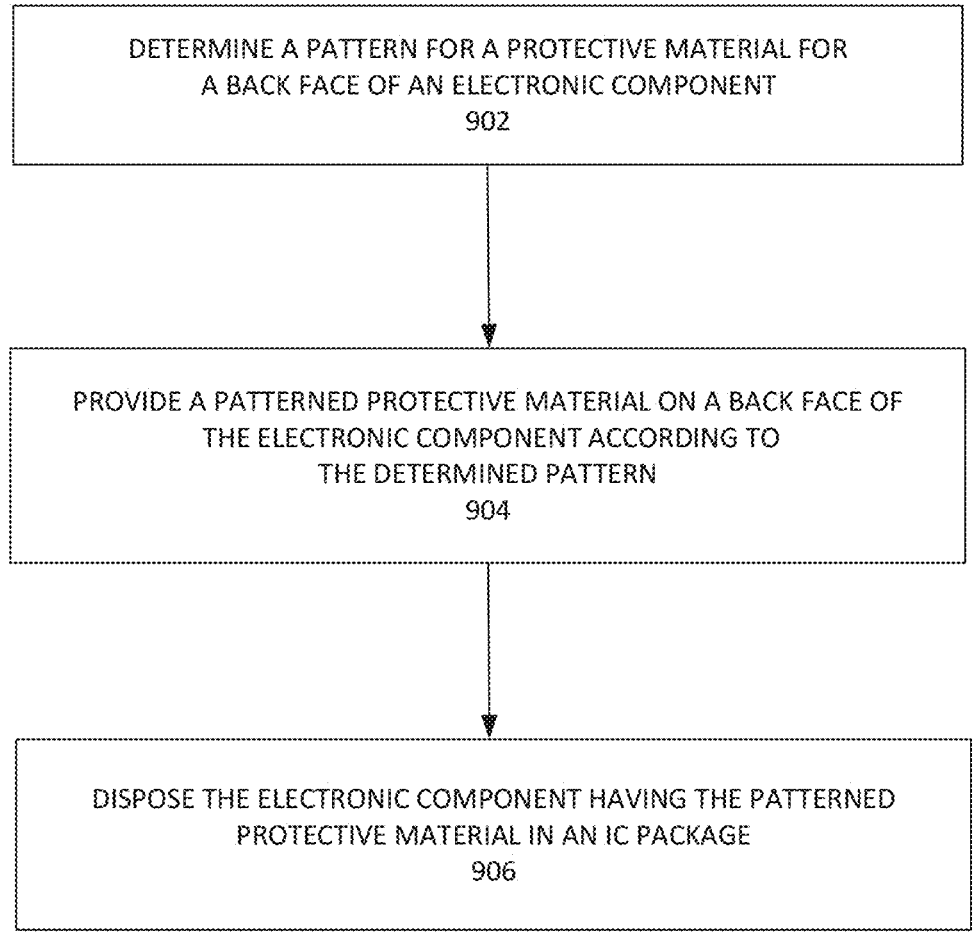
FIG. 9 is a flow diagram of an example method of manufacturing an IC package with an electronic component having a patterned protective material, in accordance with various embodiments.

FIGS. 9 and 10 are flow diagram of example methods of manufacturing an IC package and IC structure including an electronic component having a patterned protective material, in accordance with various embodiments. Although the various operations discussed with reference to the methods are shown in a particular order and once each, the operations may be performed in any suitable order (e.g., in any combination of parallel or series performance), and may be repeated or omitted as suitable. Additionally, although various operations of the methods may be illustrated with reference to particular embodiments disclosed herein, these are simply examples, and the methods may be used to form any suitable IC package and IC structure.

FIG. 9 is a flow diagram of an example method of manufacturing an IC package with an electrical component having a patterned protective material, in accordance with various embodiments. At 902, a pattern for a protective material for a back face of an electrical component may be determined. For example, the protective material may be patterned to expose a hot spot area on the back face of the electrical component, or may be patterned to cover an area that is susceptible to fracture under stress. As described above with reference to FIG. 2A, the protective material may be patterned to expose a hot spot based on a power map of the electrical component during operation or may be patterned to protect areas that are more likely to crack or chip.

At 904, a patterned protective material may be provided on the back side of the electrical component according to the determined pattern. For example, the protective material may be patterned after application, as described above with reference to FIGS. 4-6, or may be patterned during application, as described above with reference to FIGS. 7-8.

At 906, the electrical component having the patterned protective material may be disposed in an IC package. For example, disposing the electrical component having the patterned protective material is an IC package may include coupling the front side of the electronic component to a face of a package substrate by first level interconnects. In some embodiments, one or more additional electrical components may be coupled to the face of the package substrate, where the electrical component may include or may not include a patterned protective material on a back side.

FIG. 10 is a flow diagram of an example method of manufacturing an IC structure including an IC package with an electronic component having a patterned protective layer and a thermal solution, in accordance with various embodiments. At 1002, an IC package, including an electrical component having a patterned protective material on a back face, that exposes areas of the back face, may be coupled to a circuit board. For example, the IC package may include a package substrate having opposing first and second faces, where the electrical component may be electrically coupled to the first face of the package substrate via first level interconnects and the IC package may be electrically coupled to the circuit board by second level interconnects on the second face of the package substrate.

At 1004, a thermal solution may be attached to the circuit board, where the thermal solution (e.g., a heat spreader) is in thermal contact with the back face of the electrical component, where the thermal solution is in thermal contact with the patterned protective material and the exposed areas of the back face of the electrical component. In some embodiments, a thermal interface material may be disposed in the interface between the thermal solution and the back face of the electrical component.

Figure 11:
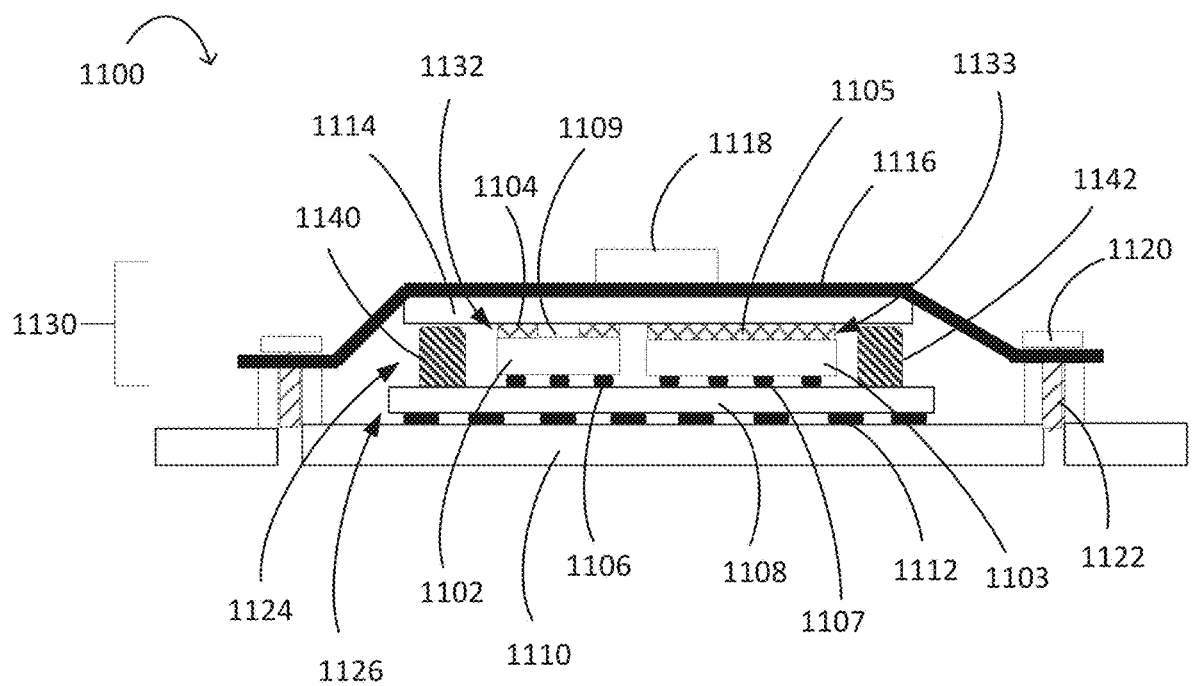
FIG. 11 is a cross-sectional side view of an IC structure including a IC package with spacers and a thermal solution, in accordance with various embodiments.

FIG. 11 is a cross-sectional side view of an IC structure including a IC package with spacers and a thermal solution, in accordance with various embodiments. The IC structure 1100 may include package substrate 1108 and one or more electrical components 1102, 1103 disposed thereon. Multiple electrical components 1102, 1103 may include a patterned protective film 1104 or an unpatterned protective film 1105, respectively, on the back side, as illustrated. Patterned protective film 1104 and unpatterned protective film 1105 may be a die back side film (DBF) or a die attach film (DAF). Multiple electrical components 1102, 1103 may be coupled to a first face 1124 of the package substrate 1108 via first level interconnects 1106, 1107, as illustrated. A second face 1126 of package substrate 1108 may be coupled to a circuit board 1110 via second level interconnects 1112. IC structure 1100 may include thermal solution 1130. Thermal solution 1130 may include a heat spreader (or cold plate) 1114, a spring plate 1116, a heat pipe 1118, a fastener 1120, 1122 (e.g., a screw, a rivet, or a clip) for securing thermal solution 1130 to circuit board 1110. When thermal solution 1130 is attached to circuit board 1110, cold plate 1114 is in thermal contact with the patterned protective film 1104, 1105 on the back side of electrical components 1102, 1103 to conduct heat away from the electrical component. Spring plate 1116 may apply a force on cold plate 1114 to improve the thermal contact between cold plate 1114 and protective films 1104, 1105 as well as the uncovered or open areas 1109 on the back side of electrical components 1102, 1103. A thermal interface material (TIM) may be included between cold plate 1114 and protective films 1104, 1105 and uncovered areas 1109 on the back side of electrical components 1102, 1103 to further improve thermal contact in the interface (not shown).

The IC structure 1100 may include spacers or standoffs 1140, 1142 in contact with package substrate 1108 on a first face and in contact with cold plate 1114 on an opposing second face to redistribute pressure and/or stress concentrations away from electrical components 1102, 1103 to reduce the likelihood of cracking and chipping. The thickness or z-height of the spacers may vary based on the placement of the spacers and/or the z-height of the electrical components measured from the first surface 1124 of the package substrate to a top face 1132, 1133 of the patterned protective material 1104, 1105. For example, spacers 1140, 1142 may be on a first face 1124 of package substrate 1108 and may be positioned between electrical components 1102, 1103, and/or may be positioned between electrical components 1102, 1103 and an outside edge of package substrate 1108 (i.e., positioned outside a footprint area of the electrical components, and not underneath the electrical components), as illustrated in FIG. 11. Spacer 1140, 1142 may be positioned to protect electrical components against stress fractures (see FIGS. 12A-12D for a detailed description). In some embodiments, for example, when spacers 1140, 1142 are positioned closer to an outside edge of package substrate as compared to an electrical component, a thickness of spacer 1140, 1142 may be less than a thickness of an electrical component plus protective material 1132, 1133. In some embodiments, for example, when spacer 1140, 1142 is positioned closer to an electrical component as compared to an outside edge of package substrate, a thickness of spacer 1140, 1142 may be equal to or greater than a thickness of an electrical component plus a thickness of protective material 1132, 1133.

Any suitable material or materials may be used to form spacer 1140, 1142. For example, in some embodiments, a spacer may include a polymer material, such as polyurethane, polyimide, silicone (e.g., polydimethylsiloxane), epoxy, acrylic, neoprene, rubber, polyester elastomer, and polyether ether ketone (PEEK). In some embodiments, a spacer 1140, 1142 may include an adhesive material, a resin material, a metal material, or a filler material, such as ceramic, glass, or silica, among others. In some embodiments, a spacer 1140, 1142 may include a plastic material. Such a plastic material may have a melting temperature greater than the melting temperature of solder included in the first level interconnects 1106, 1107 and greater than the melting temperature of solder included in the second level interconnects 1112 (e.g., approximately 260 degrees Celsius for some solders) in order to avoid melting or warpage of the spacer 1140, 1142 during solder reflow. In some embodiments, spacer 1140, 1142 may be formed from a rigid material. In some embodiments, spacer 1140, 1142 may be formed from a soft material that is compressible and/or capable of redistributing pressure when under static load. Spacer 1140, 1142 may be attached to package substrate 1108 using any suitable process, including adhesive film, or dispensed and cured, among others.

Spacer 1140, 1142 may have any suitable dimensions. In some embodiments, spacer 1140, 1142 dimensions may depend on a maximum thickness of electrical component 1102, 1103 including patterned protective material thickness 1104, 1105. For example, in some embodiments, the maximum thickness or height (e.g., z-height) of the spacers 1140, 1142 (measured from the first face 1124) may be between 100 microns and 2 millimeters (e.g., between 200 microns and 1 millimeter). Spacers 1140, 1142 may have any suitable length and width, and may be formed to fit within the surface area of package substrate 1108. Spacers 1140, 1142 may have any suitable shape, for example, cylindrical, L-shaped, linear, cubicle, or conical.

Figure 12A:
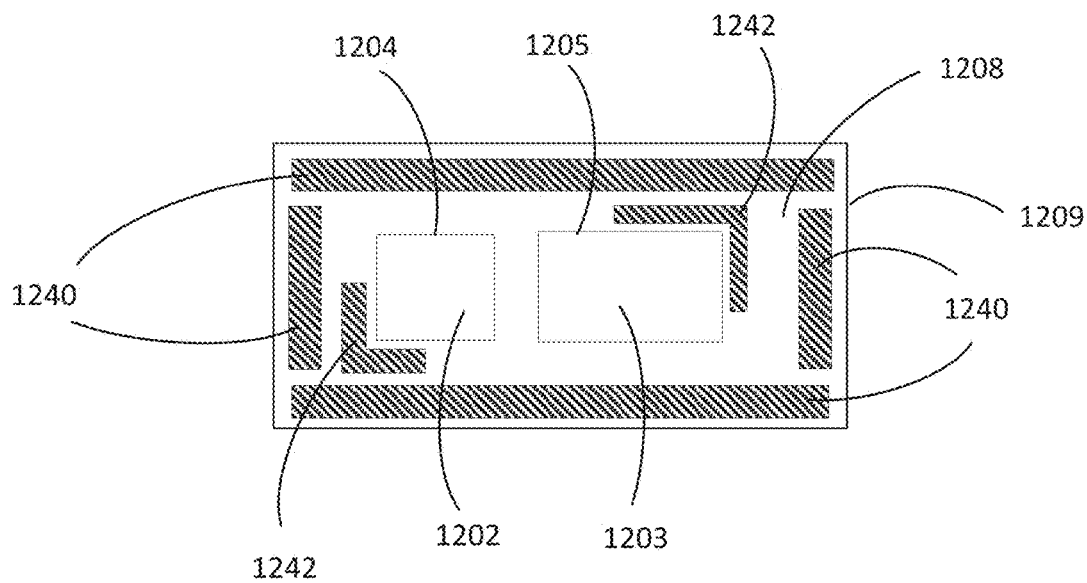
FIGS. 12A-12D are various top views of exemplary IC packages having spacers, in accordance with various embodiments.
Figure 12B:
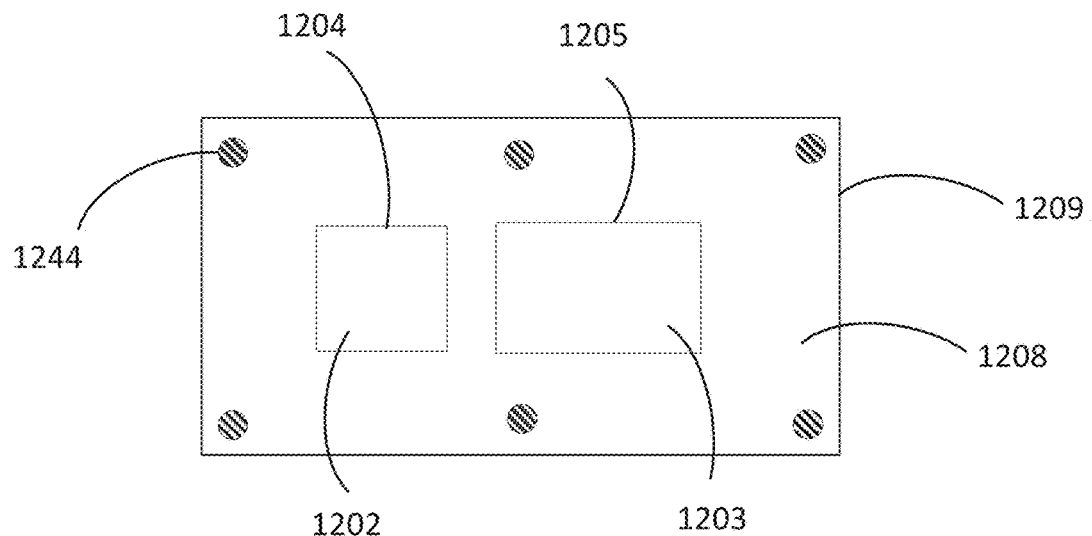
Figure 12C:
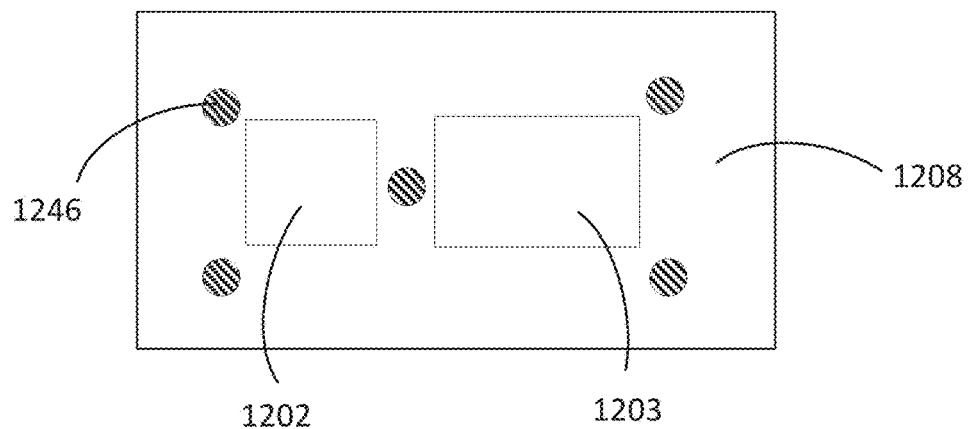
Figure 12D:
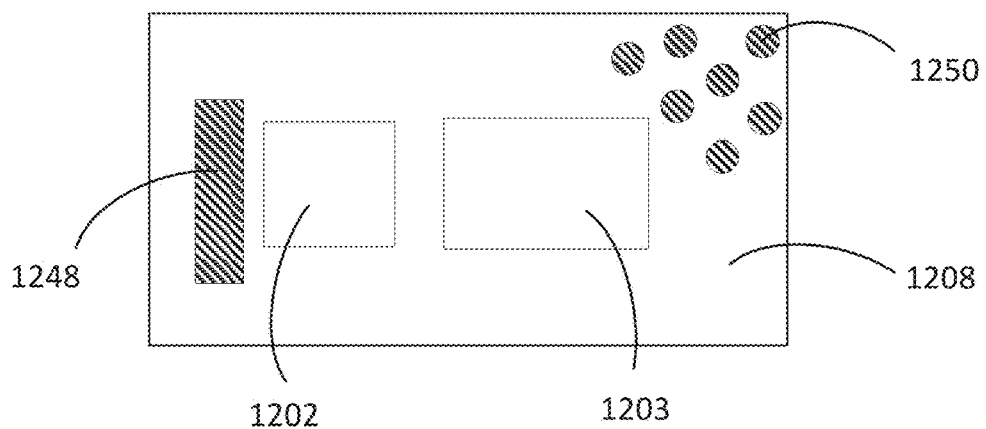

FIGS. 12A-12D are various top views of exemplary IC packages having spacers, in accordance with various embodiments. FIG. 12A illustrates various examples of spacers, including four lines of spacer material 1240 positioned on package substrate 1208 between an outside edge (e.g., perimeter) 1204, 1205 of electronic components 1202, 1203 and an outside edge (e.g., perimeter) 1209 of package substrate 1208 to form a frame surrounding electronic components 1202, 1203. FIG. 12A further illustrates two L-shaped spacers 1242, which are positioned at a corner of electronic components 1202, 1203. FIG. 12B illustrates circular or cylindrical spacers 1244 positioned along a perimeter 1209 of package substrate 1208, where six spacers are positioned on the package substrate at each corner and on two sides along an outside edge at a center point. FIG. 12C illustrates cylindrical spacers 1246 positioned at outside corners of electronic components 1202, 1203 and between electronic components 1202, 1203. FIG. 12D illustrates a combination of spacers, where a linear spacer is positioned along an outside edge of electronic component 1202 and a plurality of cylindrical spacers 1250 are grouped in a corner of package substrate 1208.

Although FIGS. 12A-12D illustrate an IC package with only two electronic components and spacers positioned around both electronic components, it may be understood that an IC package may have one or more electronic components, and that any number, shape and size of spacers may be used, including one spacer, and that the spacers may be positioned around an individual electronic component, around one or more electronic components, or around some, but not all, of the electronic components.

FIGS. 13A-B are top views of a wafer 1301 and dies 1305 that may be included in an IC package along with any of the package substrates disclosed herein. The wafer 1301 may be composed of semiconductor material and may include one or more dies 1305 having IC elements formed on a surface of the wafer 1301. Each of the dies 1305 may be a repeating unit of a semiconductor product that includes any suitable IC. After the fabrication of the semiconductor product is complete, the wafer 1301 may undergo a singulation process in which each of the dies 1305 is separated from one another to provide discrete "chips" of the semiconductor product. The die 1305 may include one or more transistors (e.g., some of the transistors 1340 of FIG. 13C, discussed below) and/or supporting circuitry to route electrical signals to the transistors, as well as any other IC components. In some embodiments, the wafer 1301 or the die 1305 may include a memory device (e.g., a static random access memory (SRAM) device), a logic device (e.g., AND, OR, NAND, or NOR gate), or any other suitable circuit element. Multiple ones of these devices may be combined on a single die 1305. For example, a memory array formed by multiple memory devices may be formed on a same die 1305 as a processing device (e.g., the processing device 1502 of FIG. 15) or other logic that is configured to store information in the memory devices or execute instructions stored in the memory array. In some embodiments, the die 1305 may include circuitry that is to couple to and interact with circuitry provided by integral devices in the package substrate, after the die 1305 is coupled to the package substrate, as discussed above.

FIG. 13C is a cross-sectional side view of an IC device 1300 that may be included in a die that may be coupled to any of the package substrates disclosed herein. In particular, one or more of the IC devices 1300 may be included in one or more dies. The IC device 1300 may be formed on a substrate 1302 (e.g., the wafer 1301 of FIG. 13A) and may be included in a die (e.g., the die 1305 of FIG. 13B). The substrate 1302 may be a semiconductor substrate composed of semiconductor material systems including, for example, N-type or P-type materials systems. The substrate 1302 may include, for example, a crystalline substrate formed using a bulk silicon or a silicon-on-insulator substructure. In some embodiments, the substrate 1302 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1302. Although a few examples of materials from which the substrate 1302 may be formed are described here, any material that may serve as a foundation for an IC device 1300 may be used. The substrate 1302 may be part of a singulated die (e.g., the dies 1305 of FIG. 13B) or a wafer (e.g., the wafer 1301 of FIG. 13A). The substrate 1302 may include conductive pathways 1303.

The IC device 1300 may include one or more device layers 1304 disposed on the substrate 1302. The device layer 1304 may include features of one or more transistors 1340 (e.g., metal oxide semiconductor field-effect transistors (MOSFETs)) formed on the substrate 1302. The device layer 1304 may include, for example, one or more source and/or drain (S/D) regions 1320, a gate 1322 to control current flow in the transistors 1340 between the S/D regions 1320, and one or more S/D contacts 1324 to route electrical signals to/from the S/D regions 1320. The transistors 1340 may include additional features not depicted for the sake of clarity, such as device isolation regions, gate contacts, and the like. The transistors 1340 are not limited to the type and configuration depicted in FIG. 13C and may include a wide variety of other types and configurations such as, for example, planar transistors, nonplanar transistors, or a combination of both. Nonplanar transistors may include FinFET transistors, such as double-gate transistors or tri-gate transistors, and wraparound or all-around gate transistors, such as nanoribbon and nanowire transistors.

Each transistor 1340 may include a gate 1322 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work-function metal or N-type work-function metal, depending on whether the transistor 1340 is to be a PMOS or an NMOS transistor. In some implementations, the gate electrode layer may consist of a stack of two or more metal layers, where one or more metal layers are work-function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, when viewed as a cross section of the transistor 1340 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1320 may be formed within the substrate 1302 adjacent to the gate 1322 of each transistor 1340. The S/D regions 1320 may be formed using either an implantation/diffusion process or an etching/deposition process, for example. In the former process, dopants such as boron, aluminum, antimony, phosphorous, or arsenic may be ion-implanted into the substrate 1302 to form the S/D regions 1320. An annealing process that activates the dopants and causes them to diffuse farther into the substrate 1302 may follow the ion-implantation process. In the latter process, the substrate 1302 may first be etched to form recesses at the locations of the S/D regions 1320. An epitaxial deposition process may then be carried out to fill the recesses with material that is used to fabricate the S/D regions 1320. In some implementations, the S/D regions 1320 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1320 may be formed using one or more alternate semiconductor materials such as germanium or a group III-V material or alloy. In further embodiments, one or more layers of metal and/or metal alloys may be used to form the S/D regions 1320.

Electrical signals, such as power and/or input/output (I/O) signals, may be routed to and/or from the transistors 1340 of the device layer 1304 through one or more interconnect layers disposed on the device layer 1304 (illustrated in FIG. 13C as interconnect layers 1306-1310). For example, electrically conductive features of the device layer 1304 (e.g., the gate 1322 and the S/D contacts 1324) may be electrically coupled with the interconnect structures 1328 of the interconnect layers 1306-1310. The one or more interconnect layers 1306-1310 may form an interlayer dielectric (ILD) stack 1319 of the IC device 1300.

The interconnect structures 1328 may be arranged within the interconnect layers 1306-1310 to route electrical signals according to a wide variety of designs (in particular, the arrangement is not limited to the particular configuration of interconnect structures 1328 depicted in FIG. 13C). Although a particular number of interconnect layers 1306-1310 is depicted in FIG. 13C, embodiments of the present disclosure include IC devices having more or fewer interconnect layers than depicted.

In some embodiments, the interconnect structures 1328 may include trench structures 1328a (sometimes referred to as "lines") and/or via structures 1328b (sometimes referred to as "holes") filled with an electrically conductive material such as a metal. The trench structures 1328a may be arranged to route electrical signals in a direction of a plane that is substantially parallel with a surface of the substrate 1302 upon which the device layer 1304 is formed. For example, the trench structures 1328a may route electrical signals in a direction in and out of the page from the perspective of FIG. 13C. The via structures 1328b may be arranged to route electrical signals in a direction of a plane that is substantially perpendicular to the surface of the substrate 1302 upon which the device layer 1304 is formed. In some embodiments, the via structures 1328b may electrically couple trench structures 1328a of different interconnect layers 1306-1310 together.

The interconnect layers 1306-1310 may include a dielectric material 1326 disposed between the interconnect structures 1328, as shown in FIG. 13C. In some embodiments, the dielectric material 1326 disposed between the interconnect structures 1328 in different ones of the interconnect layers 1306-1310 may have different compositions; in other embodiments, the composition of the dielectric material 1326 between different interconnect layers 1306-1310 may be the same.

A first interconnect layer 1306 (referred to as Metal 1 or "M1") may be formed directly on the device layer 1304. In some embodiments, the first interconnect layer 1306 may include trench structures 1328a and/or via structures 1328b, as shown. The trench structures 1328a of the first interconnect layer 1306 may be coupled with contacts (e.g., the S/D contacts 1324) of the device layer 1304.

A second interconnect layer 1308 (referred to as Metal 2 or "M2") may be formed directly on the first interconnect layer 1306. In some embodiments, the second interconnect layer 1308 may include via structures 1328b to couple the trench structures 1328a of the second interconnect layer 1308 with the trench structures 1328a of the first interconnect layer 1306. Although the trench structures 1328a and the via structures 1328b are structurally delineated with a line within each interconnect layer (e.g., within the second interconnect layer 1308) for the sake of clarity, the trench structures 1328a and the via structures 1328b may be structurally and/or materially contiguous (e.g., simultaneously filled during a dual-damascene process) in some embodiments.

A third interconnect layer 1310 (referred to as Metal 3 or "M3") (and additional interconnect layers, as desired) may be formed in succession on the second interconnect layer 1308 according to similar techniques and configurations described in connection with the second interconnect layer 1308 or the first interconnect layer 1306.

The IC device 1300 may include a solder resist material 1334 (e.g., polyimide or similar material) and one or more bond pads 1336 formed on the interconnect layers 1306-1310. The bond pads 1336 may provide the contacts to couple to first level interconnects, for example. The bond pads 1336 may be electrically coupled with the interconnect structures 1328 and configured to route the electrical signals of the transistor(s) 1340 to other external devices. For example, solder bonds may be formed on the one or more bond pads 1336 to mechanically and/or electrically couple a chip including the IC device 1300 with another component (e.g., a circuit board). The IC device 1300 may have other alternative configurations to route the electrical signals from the interconnect layers 1306-1310 than depicted in other embodiments. For example, the bond pads 1336 may be replaced by or may further include other analogous features (e.g., posts) that route the electrical signals to external components.

Figure 14:
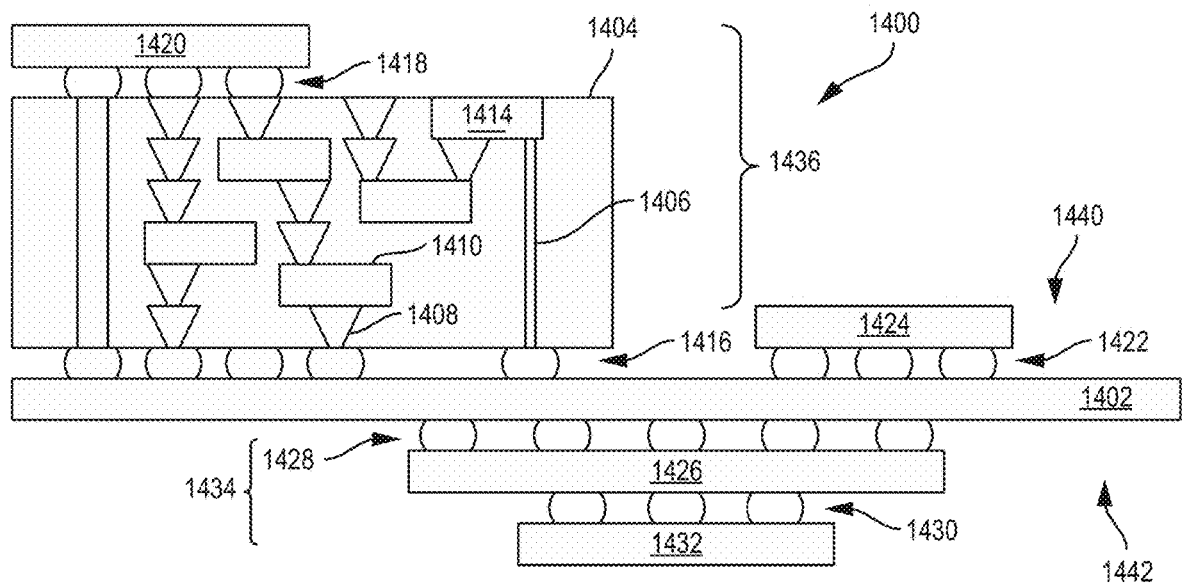
FIG. 14 is a cross-sectional side view of an IC device assembly that may include any of the embodiments of the IC packages having a patterned protective layer disclosed herein.

FIG. 14 is a cross-sectional side view of an IC device assembly 1400 that may include any of the embodiments of the package substrates disclosed herein. The IC device assembly 1400 includes a number of components disposed on a circuit board 1402. The IC device assembly 1400 may include components disposed on a first face 1440 of the circuit board 1402 and an opposing second face 1442 of the circuit board 1402; generally, components may be disposed on one or both faces 1440 and 1442.

In some embodiments, the circuit board 1402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1402. In other embodiments, the circuit board 1402 may be a non-PCB substrate.

The IC device assembly 1400 illustrated in FIG. 14 includes a package-on-interposer structure 1436 coupled to the first face 1440 of the circuit board 1402 by coupling components 1416. The coupling components 1416 may electrically and mechanically couple the package-on-interposer structure 1436 to the circuit board 1402, and may include solder balls (as shown in FIG. 14), male and female portions of a socket, an adhesive, an underfill material, and/or any other suitable electrical and/or mechanical coupling structure.

The package-on-interposer structure 1436 may include an IC package 1420 coupled to an interposer 1404 by coupling components 1418. The coupling components 1418 may take any suitable form for the application, such as the forms discussed above with reference to the coupling components 1416. For example, the coupling components 1418 may be second level interconnects. Although a single IC package 1420 is shown in FIG. 14, multiple IC packages may be coupled to the interposer 1404; indeed, additional interposers may be coupled to the interposer 1404. The interposer 1404 may provide an intervening substrate used to bridge the circuit board 1402 and the IC package 1420. The IC package 1420 may be or include, for example, a die (the die 1305 of FIG. 13B), an IC device (e.g., the IC device 1300 of FIG. 13C), or any other suitable component. In particular, the IC package 1420 may take any of the embodiments of the IC package substrates disclosed herein. Generally, the interposer 1404 may spread a connection to a wider pitch or reroute a connection to a different connection. For example, the interposer 1404 may couple the IC package 1420 (e.g., a die) to a ball grid array (BGA) of the coupling components 1416 for coupling to the circuit board 1402. In the embodiment illustrated in FIG. 14, the IC package 1420 and the circuit board 1402 are attached to opposing sides of the interposer 1404; in other embodiments, the IC package 1420 and the circuit board 1402 may be attached to a same side of the interposer 1404. In some embodiments, three or more components may be interconnected by way of the interposer 1404.

The interposer 1404 may be formed of an epoxy resin, a fiberglass-reinforced epoxy resin, a ceramic material, or a polymer material such as polyimide. In some embodiments, the interposer 1404 may be formed of alternate rigid or flexible materials that may include the same materials used in a semiconductor substrate, such as silicon, germanium, and other group III-V and group IV materials. The interposer 1404 may include metal interconnects 1408 and vias 1410, including but not limited to through-silicon vias (TSVs) 1406. The interposer 1404 may further include embedded devices 1414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 1404. The package-on-interposer structure 1436 may take the form of any of the package-on-interposer structures known in the art.

The IC device assembly 1400 may include an IC package 1424 coupled to the first face 1440 of the circuit board 1402 by coupling components 1422. The coupling components 1422 may take the form of any of the embodiments discussed above with reference to the coupling components 1416, and the IC package 1424 may take the form of any of the embodiments discussed above with reference to the IC package 1420. In particular, the IC package 1424 may take the form of any of the embodiments of the IC package disclosed herein.

The IC device assembly 1400 illustrated in FIG. 14 includes a package-on-package structure 1434 coupled to the second face 1442 of the circuit board 1402 by coupling components 1428. The package-on-package structure 1434 may include an IC package 1426 and an IC package 1432 coupled together by coupling components 1430 such that the IC package 1426 is disposed between the circuit board 1402 and the IC package 1432. The coupling components 1428 and 1430 may take the form of any of the embodiments of the coupling components 1416 discussed above, and the IC packages 1426 and 1432 may take the form of any of the embodiments of the IC package 1420 discussed above. In particular, the IC packages 1426 and 1432 may take any of the embodiments of the IC package substrates disclosed herein.

Figure 15:
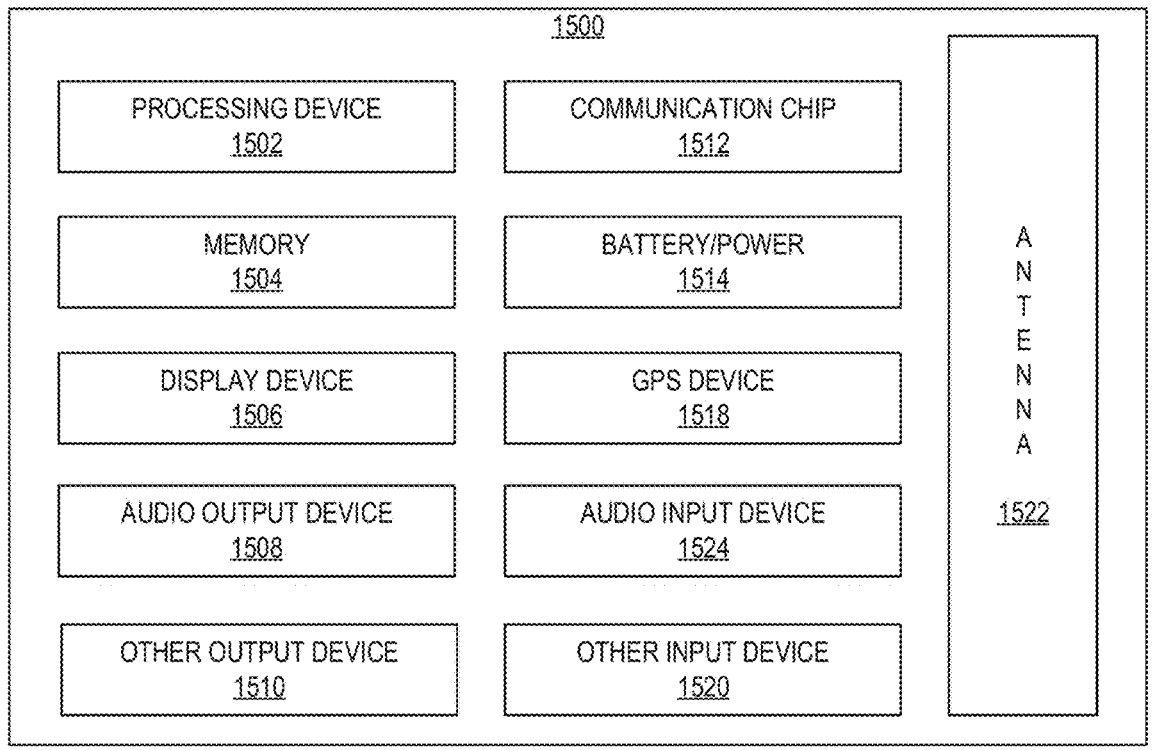
FIG. 15 is a block diagram of an example computing device that may include any of the embodiments of the IC packages having a patterned protective layer disclosed herein.

FIG. 15 is a block diagram of an example computing device 1500 that may include one or more of the IC packages and IC structures disclosed herein. A number of components are illustrated in FIG. 15 as included in the computing device 1500, but any one or more of these components may be omitted or duplicated, as suitable for the application. In some embodiments, some or all of the components included in the computing device 1500 may be attached to one or more motherboards. In some embodiments, some or all of these components are fabricated onto a single system-on-a-chip (SoC) die.

Additionally, in various embodiments, the computing device 1500 may not include one or more of the components illustrated in FIG. 15, but the computing device 1500 may include interface circuitry for coupling to the one or more components. For example, the computing device 1500 may not include a display device 1506, but may include display device interface circuitry (e.g., a connector and driver circuitry) to which a display device 1506 may be coupled. In another set of examples, the computing device 1500 may not include an audio input device 1524 or an audio output device 1508, but may include audio input or output device interface circuitry (e.g., connectors and supporting circuitry) to which an audio input device 1524 or audio output device 1508 may be coupled.

The computing device 1500 may include a processing device 1502 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1502 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1500 may include a memory 1504, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1504 may include memory that shares a die with the processing device 1502. This memory may be used as cache memory and may include embedded dynamic random access memory (eDRAM) or spin transfer torque magnetic random-access memory (STT-MRAM).

In some embodiments, the computing device 1500 may include a communication chip 1512 (e.g., one or more communication chips). For example, the communication chip 1512 may be configured for managing wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1512 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1512 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1512 may operate in accordance with other wireless protocols in other embodiments. The computing device 1500 may include an antenna 1522 to facilitate wireless communications and/or to receive other wireless communications (such as AM or FM radio transmissions).

In some embodiments, the communication chip 1512 may manage wired communications, such as electrical, optical, or any other suitable communication protocols (e.g., the Ethernet). As noted above, the communication chip 1512 may include multiple communication chips. For instance, a first communication chip 1512 may be dedicated to shorter-range wireless communications such as Wi-Fi or Bluetooth, and a second communication chip 1512 may be dedicated to longer-range wireless communications such as GPS, EDGE, GPRS, CDMA, WiMAX, LTE, EV-DO, or others. In some embodiments, a first communication chip 1512 may be dedicated to wireless communications, and a second communication chip 1512 may be dedicated to wired communications.

The computing device 1500 may include battery/power circuitry 1514. The battery/power circuitry 1514 may include one or more energy storage devices (e.g., batteries or capacitors) and/or circuitry for coupling components of the computing device 1500 to an energy source separate from the computing device 1500 (e.g., AC line power).

The computing device 1500 may include a display device 1506 (or corresponding interface circuitry, as discussed above). The display device 1506 may include any visual indicators, such as a heads-up display, a computer monitor, a projector, a touchscreen display, a liquid crystal display (LCD), a light-emitting diode display, or a flat panel display, for example.

The computing device 1500 may include an audio output device 1508 (or corresponding interface circuitry, as discussed above). The audio output device 1508 may include any device that generates an audible indicator, such as speakers, headsets, or earbuds, for example.

The computing device 1500 may include an audio input device 1524 (or corresponding interface circuitry, as discussed above). The audio input device 1524 may include any device that generates a signal representative of a sound, such as microphones, microphone arrays, or digital instruments (e.g., instruments having a musical instrument digital interface (MIDI) output).

The computing device 1500 may include a global positioning system (GPS) device 1518 (or corresponding interface circuitry, as discussed above). The GPS device 1518 may be in communication with a satellite-based system and may receive a location of the computing device 1500, as known in the art.

The computing device 1500 may include an other output device 1510 (or corresponding interface circuitry, as discussed above). Examples of the other output device 1510 may include an audio codec, a video codec, a printer, a wired or wireless transmitter for providing information to other devices, or an additional storage device.

The computing device 1500 may include an other input device 1520 (or corresponding interface circuitry, as discussed above). Examples of the other input device 1520 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1500 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1500 may be any other electronic device that processes data.

The following paragraphs provide various examples of the embodiments disclosed herein.

Example 1 is a computing device, including: an integrated circuit (IC) package including: a package substrate having a first face and an opposing second face; an electronic component having a front face and an opposing back face, wherein the front face of the electronic component is electrically coupled to the first face of the package substrate, and a protective material on the back face of the electronic component, wherein the protective material is patterned to include an area on the back face of the electronic component that is covered by the protective material and an area on the back face of the electronic component that is not covered by the protective material; a circuit board, wherein the second face of the package substrate is electrically coupled to a face of the circuit board; and a heat spreader, wherein the heat spreader is secured to the circuit board and in thermal contact with the area on the back face of the electronic component that is not covered by the protective material through a thermal interface material.

Example 2 may include the subject matter of Example 1, and may further specify that the area on the back face of the electronic component that is not covered by the protective material is a hot spot, and wherein the hot spot is an area on the face that exceeds a temperature of 80 degrees Celsius during operation of the electronic component.

Example 3 may include the subject matter of any of Examples 1-2, and may further specify that a thickness of the protective material is less than 50 microns.

Example 4 may include the subject matter of any of Examples 1-3, and may further specify that a thickness of the protective material is less than 20 microns.

Example 5 may include the subject matter of any of Examples 1-4, and may further specify that a surface area of the protective material is 50 percent or less of a surface area of the back face of the electronic component.

Example 6 may include the subject matter of any of Examples 1-5, and may further specify that the protective material comprises one of more of: a polymer, silicon, glass, ceramic, metal, plastic, adhesive, and resin.

Example 7 may include the subject matter of any of Examples 1-6, and may further specify that the protective material is a die backside film (DBF) or a die attach film (DAF).

Example 8 may include the subject matter of any of Examples 1-7, and may further include: a spacer on the face of the package substrate, wherein the spacer is positioned between an outside edge of the electronic component and an outside edge of the package substrate.

Example 9 may include the subject matter of any of Examples 1-8, and may further specify that the electrical component includes a processing die.

Example 10 may include the subject matter of Example 9, and may further specify that the processing die is a central processing unit (CPU) die.

Example 11 is a method, including: electrically coupling an integrated circuit (IC) package to a circuit board, wherein the IC package comprises: an electronic component electrically coupled to a package substrate, the electronic component having a protective material on a back face, wherein the protective material is patterned to include an area on the back face of the electronic component that is not covered by the protective material; and securing a heat spreader to the circuit board, where the heat spreader is in thermal contact with the area on the back face of the electronic component that is not covered by the protective material.

Example 12 may include the subject matter of Example 11, and may further specify that the IC package further includes a spacer on the face of the package substrate positioned between an outside edge of the electronic component and an outside edge of the package substrate, the method further including: placing the heat spreader in contact with the spacer before securing the heat spreader to the circuit board.

Example 13 is an integrated circuit (IC) package, including: a package substrate; an electronic component having opposing first and second faces, wherein the first face is electrically coupled to a face of the package substrate; and a spacer on the face of the package substrate, wherein the spacer is positioned between the electronic component and an outside edge of the package substrate.

Example 14 may include the subject matter of Example 13, and may further specify that the spacer comprises one or more of: a polymer, an adhesive, a resin, a metal, a plastic, and a filler material.

Example 15 may include the subject matter of any of Examples 13-14, and may further specify that a thickness of the spacer is less than an overall thickness of the electronic component.

Example 16 may include the subject matter of any of Examples 13-15, and may further specify that a thickness of the spacer is greater than or equal to an overall thickness of the electronic component.

Example 17 may include the subject matter of any of Examples 13-16, and may further specify that the spacer comprises one or more dots positioned at one or more corners on the face of the package substrate.

Example 18 may include the subject matter of any of Examples 13-17, and may further specify that the spacer comprises a frame positioned between the electronic component and a perimeter of the package substrate.

Example 19 may include the subject matter of any of Examples 13-18, and may further specify that the spacer comprises one or more L-shapes positioned at one or more corners of the electronic component on the face of the package substrate.

Example 20 may include the subject matter of any of Examples 13-19, and may further specify that the electronic component includes a patterned protective material on the second face of the electronic component.

Example 21 is a method of manufacturing an integrated circuit (IC) package, including: electrically coupling an electronic component to a face of a package substrate; and providing a spacer on the face of the package substrate, wherein the spacer is positioned between an outside edge of the electronic component and an outside edge of the package substrate.

Example 22 is an integrated circuit (IC) package, including: a package substrate; an electronic component having a front face and an opposing back face, wherein the front face is electrically coupled to a face of the package substrate, wherein the back face has a hot spot, and wherein the hot spot is an area on the back face that exceeds a temperature of 80 degrees Celsius during operation of the electronic component; and a patterned protective material on the back face of the electronic component, wherein the patterned protective material exposes the hot spot.

Example 23 may include the subject matter of Example 22, and may further specify that a thickness of the patterned protective material is less than 50 microns.

Example 24 may include the subject matter of any of Examples 22-23, and may further specify that a thickness of the patterned protective material is less than 20 microns.

Example 25 may include the subject matter of any of Examples 22-24, and may further specify that a surface area of the patterned protective material is 50 percent or less of a surface area of the back face of the electronic component.

Example 26 may include the subject matter of any of Examples 22-25, and may further specify that the patterned protective material comprises one of more of: a polymer, silicon, glass, ceramic, metal, plastic, adhesive, and resin.

Example 27 may include the subject matter of any of Examples 22-26, and may further specify that the patterned protective material is a patterned die backside film (DBF) or a patterned die attach film (DAF).

Example 28 may include the subject matter of any of Examples 22-27, and may further include: a spacer on the face of the package substrate, wherein the spacer is positioned between an outside edge of the electronic component and an outside edge of the package substrate.

Example 29 may include the subject matter of any of Examples 22-28, and may further specify that the electrical component includes a processing die.

Example 30 may include the subject matter of Example 29, and may further specify that the processing die is a central processing unit (CPU) die.

Example 31 is a method including: creating a power map of a face of an electronic component to identify a hot spot, wherein the hot spot is an area on the face that exceeds a temperature of 80 degrees Celsius during operation of the electronic component; determining a pattern for a protective material on the face of the electronic component, wherein the pattern exposes the hot spot; and providing the protective material on the face of the electronic component according to the determined pattern.

Example 32 may include the subject matter of Example 31, and may further specify that the protective material is patterned after the protective material is deposited on the face of the electronic component.

Example 33 may include the subject matter of Example 32, and may further specify that the protective material is patterned using a laser to remove the protective material.

Example 34 may include the subject matter of Example 31, and may further specify that the protective material is patterned by depositing the protective material on the face of the electronic component without depositing the protective material on the hot spot.

Example 35 may include the subject matter of Example 34, and may further specify that the protective material is deposited using an applicator that is patterned to expose the hot spot.

Example 36 may include the subject matter of Example 31, and may further specify that the face of the electronic component is a back face and the electronic component has an opposing front face, further including: coupling the front face of the electronic component to a face of a package substrate.

Example 37 may include the subject matter of Example 36, and may further include: depositing a spacer on the face of the package substrate, wherein the spacer is positioned between an outside edge of the electronic component and an outside edge of the package substrate.

The invention claimed is:

1. A computing device, comprising:
an integrated circuit (IC) package, the IC package comprising:
a package substrate having a first face and an opposing second face;
an electronic component having a front face and an opposing back face, wherein the front face of the electronic component is electrically coupled to the first face of the package substrate, and
a protective material on the back face of the electronic component, wherein the protective material is patterned to include an area on the back face of the electronic component that is covered by the protective material and an area on the back face of the electronic component that is not covered by the protective material, and wherein a thickness of the protective material is less than 20 microns;
a circuit board, wherein the second face of the package substrate is electrically coupled to a face of the circuit board; and
a heat spreader, wherein the heat spreader is secured to the circuit board and in thermal contact with the area on the back face of the electronic component that is not covered by the protective material through a thermal interface material.

2. The computing device of claim 1, wherein the area on the back face of the electronic component that is not covered by the protective material is a hot spot, and wherein the hot spot is an area on the face that exceeds a temperature of 80 degrees Celsius during operation of the electronic component.

3. The computing device of claim 1, wherein a surface area of the protective material is 50 percent or less of a surface area of the back face of the electronic component.

4. The computing device of claim 1, wherein the protective material comprises one of more of: a polymer, silicon, glass, ceramic, metal, plastic, adhesive, and resin.

5. The computing device of claim 1, further comprising:
a spacer on the face of the package substrate, wherein the spacer is positioned between an outside edge of the electronic component and an outside edge of the package substrate.

6. The computing device of claim 1, wherein the electrical component includes a processing die.

7. An integrated circuit (IC) package, comprising:
a package substrate;
an electronic component having a front face and an opposing back face, wherein the front face is electrically coupled to a face of the package substrate;
a protective material on the back face of the electronic component, wherein the protective material is patterned to include an area on the back face of the electronic component that is covered by the protective material and an area on the back face of the electronic component that is not covered by the protective material, and wherein a thickness of the protective material is less than 20 microns; and
a spacer on the face of the package substrate, wherein the spacer is positioned between the electronic component and an outside edge of the package substrate.

8. The IC package of claim 7, wherein the spacer comprises one or more of: a polymer, an adhesive, a resin, a metal, a plastic, and a filler material.

9. The IC package of claim 7, wherein a thickness of the spacer is less than an overall thickness of the electronic component.

10. The IC package of claim 7, wherein a thickness of the spacer is greater than or equal to an overall thickness of the electronic component.

11. The IC package of claim 7, wherein the spacer comprises one or more dots positioned at one or more corners on the face of the package substrate.

12. The IC package of claim 7, wherein the spacer comprises a frame positioned between the electronic component and a perimeter of the package substrate.

13. The IC package of claim 7, wherein the spacer comprises one or more L-shapes positioned at one or more corners of the electronic component on the face of the package substrate.

* * * * *

UNITED STATES PATENT AND TRADEMARK OFFICE
CERTIFICATE OF CORRECTION

PATENT NO. : 10,957,656 B2
APPLICATION NO. : 16/641601
DATED : March 23, 2021
INVENTOR(S) : Kyle Yazzie et al.

Page 1 of 1

It is certified that error appears in the above-identified patent and that said Letters Patent is hereby corrected as shown below:

In the Claims

In Column 24, Line 21, in Claim 4, delete "one of" and insert -- one or --, therefor.

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*